(12) United States Patent
Kim et al.

(10) Patent No.: US 11,048,352 B2
(45) Date of Patent: Jun. 29, 2021

(54) DISPLAY DEVICE

(71) Applicant: SAMSUNG DISPLAY CO., LTD., Yongin-si (KR)

(72) Inventors: Dong Soo Kim, Suwon-si (KR); Mi Na Kim, Suwon-si (KR); Kwang Chul Jung, Seoul (KR); Yong Jun Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/848,413

(22) Filed: Apr. 14, 2020

(65) Prior Publication Data

US 2021/0064169 A1    Mar. 4, 2021

(30) Foreign Application Priority Data

Sep. 4, 2019  (KR) .................. 10-2019-0109481

(51) Int. Cl.
  *G06F 3/041*  (2006.01)
  *H01L 27/32*  (2006.01)
  *H01L 51/52*  (2006.01)

(52) U.S. Cl.
  CPC .......... *G06F 3/0412* (2013.01); *H01L 27/323* (2013.01); *H01L 27/3246* (2013.01); *H01L 51/525* (2013.01); *H01L 51/5246* (2013.01)

(58) Field of Classification Search
  CPC ... G06F 3/0412; G06F 3/0445; H01L 27/323; H01L 27/3244; H01L 51/5253
  See application file for complete search history.

(56) References Cited

U.S. PATENT DOCUMENTS

2018/0033801 A1*  2/2018  Koide ............... H01L 27/1218
2018/0373372 A1* 12/2018  Kim ................. H01L 51/5253

FOREIGN PATENT DOCUMENTS

| CN | 108922980       | 11/2018 |
| KR | 10-2017-0029162 |  3/2007 |
| KR | 10-2015-0136566 | 12/2015 |
| KR | 10-2016-0026170 |  3/2016 |
| KR | 10-2018-0047587 |  5/2018 |

\* cited by examiner

*Primary Examiner* — Insa Sadio
(74) *Attorney, Agent, or Firm* — F. Chau & Associates, LLC

(57) ABSTRACT

A display device includes a first substrate having a display area, a non-display area surrounding the display area, and a protruding area. A first sensing pad part is formed in the non-display area adjacent to the protruding area. A circuit element layer is positioned in the display area. A display element layer is positioned on the circuit element layer and includes a light-emitting layer and a second electrode on the light-emitting layer. A second substrate overlaps the first substrate and does not overlap the protruding area. A second sensing pad part is formed on the second substrate to overlap with the first sensing pad part. A sealing member is disposed along a border of the second substrate and attaches the first substrate to the second substrate. The first sensing pad part and the second sensing pad part are disposed between a border of the second electrode and the sealing member.

21 Claims, 18 Drawing Sheets

DISPLAY DEVICE

CROSS-REFERENCE TO RELATED APPLICATION

This application claims priority under 35 U.S.C. § 119 to Korean Patent Application No. 10-2019-0109481, filed on Sep. 4, 2019 in the Korean Intellectual Property Office, the disclosure of which is incorporated by reference in its entirety herein.

1. TECHNICAL FIELD

The present invention relates to a display device.

2. DISCUSSION OF RELATED ART

Numerous electronic devices have been developed that include a display device for displaying an image to the user, such as smartphones, tablet PCs, digital cameras, notebook computers, navigation devices, and smart televisions. The display device includes a display panel for generating and displaying an image and various input devices.

Touch sensors for recognizing a touch input have also been applied to display devices, such as display devices for smartphones and tablet PCs. The touch sensors are often configured to replace a conventional keypad as an input device for the electronic device.

An organic light emitting display device may have an in-cell touch structure in which a first substrate with an organic light emitting diode and a second substrate with a touch electrode array are arranged to face each other and are bonded together by a sealing member. A plurality of lower pad electrodes for applying a signal to the touch electrode array are provided in a non-display area of the first substrate. The plurality of lower pad electrodes may be formed to be bonded to an upper pad electrode connected to a touch electrode of the touch electrode array of the second substrate through a conductive member.

SUMMARY

Aspects of the present invention provide a display device having an in-cell touch structure with a reduced dead space by disposing upper and lower pad electrodes inside a sealing member.

However, exemplary embodiments of the present invention are not restricted to those set forth herein. Other technical aspects not mentioned will be clearly understood by those skilled in the art from the following description.

A display device according to an exemplary embodiment of the present invention includes a first substrate having a display area, a non-display area surrounding the display area, and a protruding area extending from a side of the non-display area. A first sensing pad part is formed in the non-display area adjacent to the protruding area on the first substrate. A circuit element layer is positioned in the display area on the first substrate. A display element layer is positioned on the circuit element layer. The display element layer includes a light-emitting layer and a second electrode positioned on the light-emitting layer. A second substrate is disposed to overlap the first substrate in a thickness direction, wherein the second substrate does not overlap the protruding area. A second sensing pad part is formed on the second substrate to overlap with the first sensing pad part in the thickness direction. A sealing member is disposed along a border of the second substrate and configured to attach the first substrate and the second substrate to each other. The first sensing pad part and the second sensing pad part are disposed between a border of the second electrode and the sealing member.

A display device according to an exemplary embodiment of the present invention includes a first substrate having a display area and a non-display area. The first substrate includes a plurality of corners. Each of the plurality of corners of the first substrate has a first radius of curvature. A circuit element layer is positioned on the display area of the first substrate. A display element layer is positioned on the circuit element layer. The display element layer includes a light-emitting layer and a second electrode positioned on the light-emitting layer. The second electrode has a border in the non-display area. A second substrate is disposed to overlap the first substrate in a thickness direction. The second substrate includes a plurality of corners. Each of the plurality of corners of the second substrate has the first radius of curvature. A sealing member is disposed along a border of the second substrate and overlaps the non-display area of the first substrate in the thickness direction. The sealing member is configured to attach the first substrate and the second substrate to each other. The sealing member has a plurality of corners. Each of the plurality of corners of the sealing member has the first radius of curvature. The border of the second electrode includes a plurality of corners. At least one of the plurality of corners of the border of the second electrode has the first radius of curvature and at least one of the plurality of corners of the border of the second electrode has a second radius of curvature that is greater than the first radius of curvature. The second radius of curvature provides a larger space between the border of the second electrode and the sealing member than the first radius of curvature. A first sensing pad part is disposed on the non-display area of the first substrate and a second sensing pad part disposed on the second substrate. The first sensing pad part and the second sensing pad part overlap each other and are disposed between the border of the second electrode having the second radius of curvature and the sealing member.

Specific details of other exemplary embodiments are included in the detailed description and drawings. According to exemplary embodiments of the present invention, upper and lower pad electrodes may be disposed inside a sealing member to provide a display device having an in-cell sensing structure with a reduced dead space.

Benefits according to the exemplary embodiments are not limited by the contents exemplified above, and more various benefits are included herein.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF EXEMPLARY EMBODIMENTS

Figure 1:
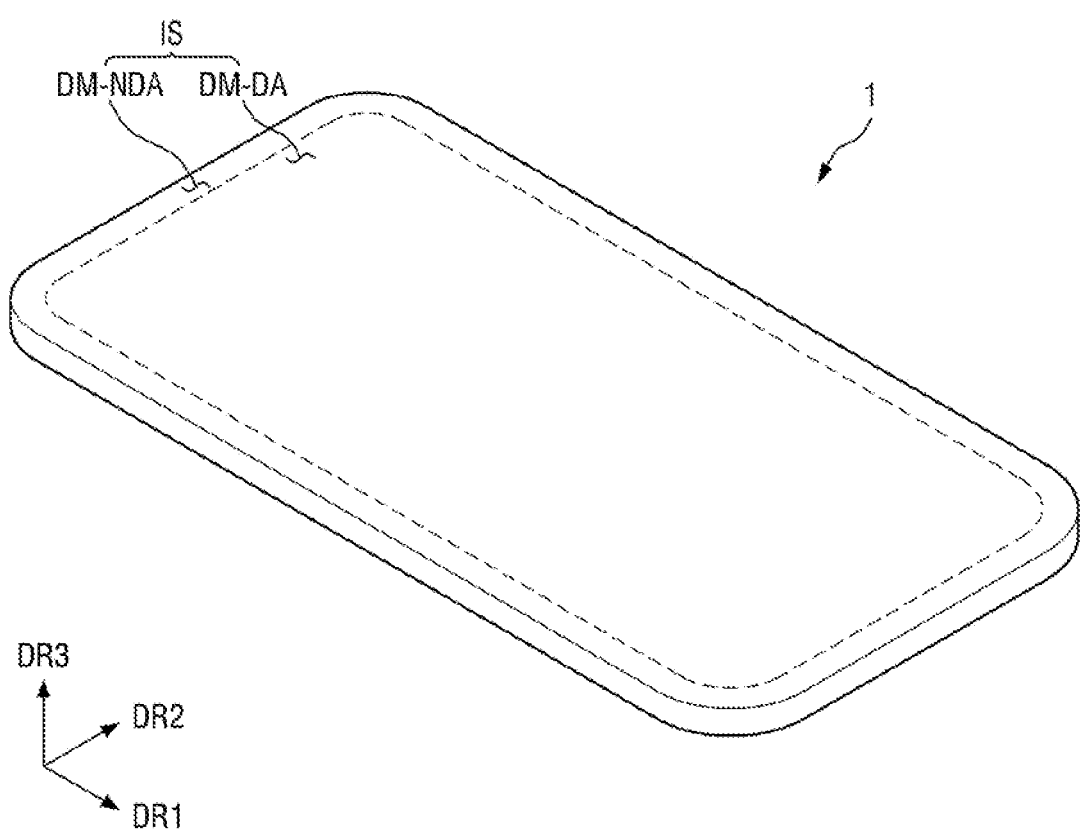
FIG. 1 is a perspective view of a display device according to an exemplary embodiment of the present inventive concepts.

The present invention will now be described more fully hereinafter with reference to the accompanying drawings, in which exemplary embodiments of the present inventive concepts are shown. This invention may, however, be embodied in different forms and should not be construed as limited to the exemplary embodiments set forth herein. The same reference numbers indicate the same components throughout the specification. In the attached figures, the thickness of layers and regions may be exaggerated for clarity.

The present inventive concepts will be described with reference to perspective views, cross-sectional views, and/or plan views, in which exemplary embodiments of the present inventive concepts are shown. Thus, the profile of an exemplary view may be modified according to manufacturing techniques and/or allowances. The exemplary embodiments of the present inventive concepts are not intended to limit the scope of the present invention and the present inventive concepts may cover all changes and modifications that can be caused due to a change in manufacturing process. Thus, regions shown in the drawings are illustrated in schematic form and the shapes of the regions are presented simply by way of illustration and not as a limitation.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" is relative and may encompass both an orientation of above and below. The device may be otherwise oriented (rotated 90 degrees or at other orientations) and the spatially relative descriptors used herein interpreted accordingly.

Although the terms "first", "second", etc. may be used herein to describe various elements, these elements should not be limited by these terms. These terms may be used to distinguish one element from another element. Thus, a first element discussed below may be termed a second element without departing from teachings of one or more exemplary embodiments. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Throughout the specification, the same reference numerals are used for the same or similar elements.

Hereinafter, exemplary embodiments of the present inventive concepts will be described with reference to the accompanying drawings.

Figure 2:
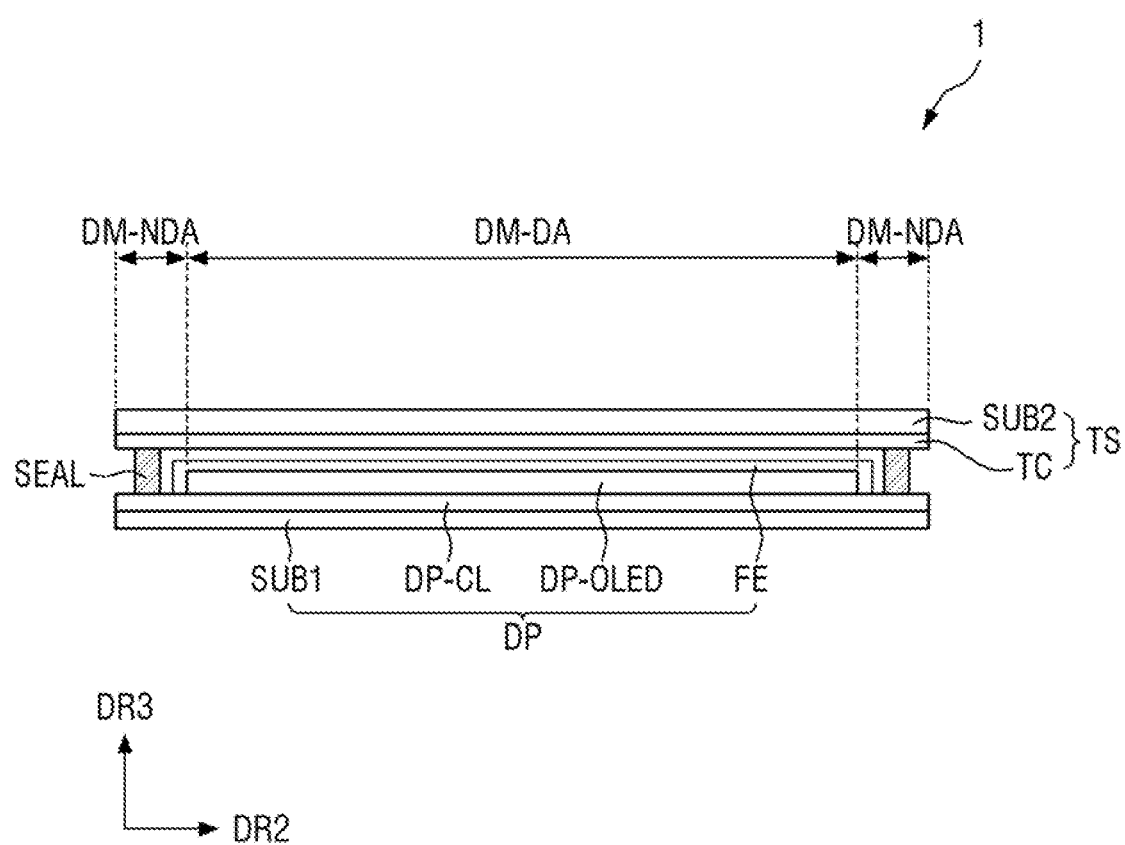
FIG. 2 is a cross-sectional view of the display device shown in FIG. 1 according to an exemplary embodiment of the present inventive concepts

FIG. 1 is a schematic perspective view of a display device according to an exemplary embodiment of the present inventive concepts, and FIG. 2 is a schematic cross-sectional view of the display device shown in FIG. 1.

Referring to FIGS. 1 and 2, a display device 1 includes a display surface IS on which an image is displayed. In an exemplary embodiment, the display surface IS may extend in a plane defined by a first direction DR1 and a second direction DR2. A third direction DR3 that is perpendicular to the first direction DR1 and the second direction DR2 indicates a normal direction of the display surface IS, such as a thickness direction of the display device 1. A front (or top) surface and a back (or bottom) surface of each member are divided by the third direction DR3. However, directions indicated by the first to third directions DR), DR2, and DR3 are relative concepts and may be converted to other directions.

In the exemplary embodiment shown in FIG. 1, the display device 1 is shown to have a flat display surface IS extending in the first direction DR1 and the second direction DR2. However, exemplary embodiments of the present inventive concepts are not limited thereto. For example, the display device 1 may include a curved display surface or a three-dimensional display surface (e.g., a polygonal display surface) including a plurality of display areas having display surfaces in different directions.

In some exemplary embodiments of the present inventive concepts, the display device 1 may be a rigid display device or a flexible display device. In the exemplary embodiment of FIG. 1, the electronic device that includes the display device 1 is a portable electronic device. The portable electronic device may include a tablet PC, a smartphone, a personal digital assistant (PDA), a portable multimedia player (PMP), a gaming machine, a wrist watch type electronic device, or the like. However, exemplary embodiments of the present inventive concepts are not limited to the specific kind of the electronic device that includes the display device 1. For example, in another exemplary embodiment of the present inventive concepts, the display device 1 may be included in a large, non-portable electronic device such as a television or an external billboard, or a small and medium-sized electronic device such as a personal computer, a notebook computer, a car navigation device, a smart watch, a camera, or the like.

In some exemplary embodiments of the present inventive concepts, the display device 1 may have a planar rectangular shape. For example, as shown in the exemplary embodiment of FIG. 1, the display device 1 may include two relatively longer sides extending in the first direction DR1 and two relatively shorter sides extending in the second direction DR2. The corners where the relatively longer sides and the relatively shorter side of the display device 1 meet may be at a right angle. However, exemplary embodiments of the present inventive concepts are not limited thereto and the corners may have a curved surface, etc. Alternatively, the corner of the display device 1 may be chamfered to reduce the risk of breakage. In addition, the shape of the display device 1 (e.g., in a plan view when viewed from the third direction DR3) is not limited to the rectangular shape illustrated in FIG. 1. For example, in other exemplary embodiments, the shape of the display device may be circular, another polygonal shape, or various other shapes.

The display surface IS of the display device 1 includes a display area DM-DA on which an image is displayed and a non-display area DM-NDA adjacent to the display area DM-DA. The non-display area DM-NDA is an area where no image is displayed.

In some exemplary embodiments of the present inventive concepts, the display area DM-DA may be generally rectangular in shape. In some exemplary embodiments of the present inventive concepts, a corner of the display area DM-DA may form a curved surface as shown in FIG. 1. However, exemplary embodiments of the present inventive concepts are not limited thereto. Hereinafter, an exemplary embodiment in which the corner of the display area DM-DA forms the curved surface will be described as an example.

The non-display area DM-NDA may surround the display area DM-DA. For example, as shown in the exemplary embodiment of FIG. 1, the non-display area DM-NDA surrounds all four sides of the display area DM-DA. However, exemplary embodiments of the present inventive concepts are not limited thereto, and a shape of the display area DM-DA and a shape of the non-display area DM-NDA may have various different arrangements.

Unless otherwise defined, herein, the terms "upper", "upper side", "upper portion", "top", and "upper surface" mean a side to which an arrow of the third direction DR3 is facing where the first direction DR1 and the second direction DR2 intersect based on the drawing, and the terms "lower," "lower side," "lower portion," "bottom," and "lower surface" mean an opposite side of a direction in which the arrow in the third direction DR3 is directed based on the drawing.

FIG. 2 is a cross-sectional view of a display device 1 according to an exemplary embodiment of the present inventive concepts. FIG. 2 illustrates a cross-sectional view defined by the second direction DR2 and the third direction DR3.

As shown in the exemplary embodiment of FIG. 2, the display device 1 includes a first substrate SUB1 of a display panel DP and a second substrate SUB2 of a sensor TS. The display panel DP is disposed to face the sensor TS (e.g., overlapping with each other in the third direction DR3), and the first substrate SUB1 of the display panel DP and the second substrate SUB2 of the sensor TS are attached to each other by a sealing member SEAL. The display panel DP generates an image, and the sensor TS obtains coordinate information of an external input (e.g., a touch event). For example, the sensor TS may include at least one sensing device selected from a touch sensor, a proximity sensor, a motion sensor, and a fingerprint scan sensor. However, exemplary embodiments of the present inventive concepts are not limited thereto. The display device 1 disclosed herein may use a combination of information sensed by at least two or more of these sensors.

The display device 1 may further include a protection member disposed below the display panel DP (e.g., in the third direction DR3) and at least one of an antireflection member and a window member disposed above the sensor TS (e.g., in the third direction DR3).

In some exemplary embodiments of the present inventive concepts, the display panel DP may be a display panel including a self-emitting light element. In an exemplary embodiment of the present inventive concepts, the self-emitting light element may include at least one of an organic light emitting diode, a quantum dot light emitting diode, an inorganic based micro light emitting diode (e.g., a micro LED), an inorganic based nano light emitting diode (e.g., Nano LED). Hereinafter, for convenience of description, an embodiment in which the self-emitting light element is an organic light emitting diode will be described as an example. However, exemplary embodiments of the present inventive concepts are not limited thereto.

The display panel DP may include a first substrate SUB1; a circuit element layer DP-CL, a display element layer DP-OLED, a first layer FE, and a touch sensing element layer TC, which are sequentially disposed on the first substrate SUB1 (e.g., in the third direction DR3). Although not separately illustrated, the display panel DP may further include functional layers such as an antireflection layer, a refractive index control layer, or the like.

In some exemplary embodiments of the present inventive concepts, the first substrate SUB1 may be made of an insulating material such as glass, quartz, polymer resin, or the like. However, exemplary embodiments of the present inventive concepts are not limited thereto. In an exemplary embodiment, the polymer material may include at least one material selected from polyethersulphone (PES), polyacrylate (PA), polyarylate (PAR), polyetherimide (PEI), polyethylene napthalate (PEN), polyethylene terephthalate (polyethylene terepthalate (PET), polyphenylene sulfide (PPS), polyallylate, polyimide (PI), polycarbonate (PC), cellulose triacetate (CAT), cellulose acetate propionate (CAP) and a combination thereof. The first substrate SUB1 may include a metal material.

The first substrate SUB1 may be a rigid substrate or a flexible substrate capable of bending, folding, rolling, or the like. An example of a material forming the flexible substrate includes polyimide (PI). However, exemplary embodiments of the present inventive concepts are not limited thereto.

The display area DM-DA and the non-display area DM-NDA described with reference to FIG. 1 may be defined on the first substrate SUB1 in the same manner.

The circuit element layer DP-CL includes at least one intermediate insulating layer and a circuit element. The intermediate insulating layer includes at least one intermediate inorganic layer and at least one intermediate organic layer. The circuit element includes signal lines, a driving circuit of a pixel, or the like. In an exemplary embodiment, the circuit element layer DP-CL may be formed through an insulating layer forming process by coating, vapor deposition, or the like, and a patterning process of a conductor layer and/or a semiconductor layer by a photolithography process.

The display element layer DP-OLED includes a self-emitting light element. For example, the self-emitting light element may be an organic light emitting diode. The display element layer DP-OLED may further include an organic layer such as a pixel defining layer.

The first layer FE is disposed above the display element layer DP-OLED and seals the display element layer. The first layer FE may include a capping layer. The first layer FE includes at least one inorganic layer (hereinafter, an encapsulation inorganic layer). The first layer FE may further include at least one organic layer (hereinafter, an encapsulation organic layer). The encapsulation inorganic layer protects the display element layer DP-OLED from moisture/oxygen, and the encapsulation organic layer protects the display element layer DP-OLED from foreign matter such as dust particles and other contaminants. In an exemplary embodiment, the first layer FE may include a silicon nitride layer, a silicon oxy nitride layer and a silicon oxide layer, a titanium oxide layer, an aluminum oxide layer, or the like. The first layer FE may include an acryl-based organic layer. However, exemplary embodiments of the present inventive concepts are not limited thereto.

In some exemplary embodiments of the present inventive concepts, the first layer FE may not be included and an encapsulation substrate or the like may be disposed on the display element layer DP-OLED to provide protection therefor. The encapsulation substrate may seal the display element layer DP-OLED with a sealant.

The sensor TS may include the second substrate SUB2 and a sensing element layer TC positioned on the second substrate SUB2. For example, as shown in the exemplary embodiment of FIG. 2, a top surface of the sensing element layer TC may directly contact a bottom surface of the second substrate SUB2. The bottom surface of the second substrate SUB2 may face a top surface of the first substrate SUB1.

The sensor TS senses at least one of information in the display device, environmental information and user information, and generates a sensing signal corresponding thereto. A controller may control the driving or operation of the display device or perform data processing, function, or operation related to an application program installed in the display device, based on the sensing signal. Examples of sensors that may be included in a sensing unit will be described in more detail.

A proximity sensor refers to a sensor that detects the presence or absence of an object approaching a predetermined detection surface or an object present in the vicinity by using an electromagnetic force, infrared rays, or the like without mechanical contact between the object and a sensing surface of the sensor. Such a proximity sensor may be disposed in an inner area of the display device covered by a touch screen as described above or near the touch screen.

Examples of the proximity sensor include a transmission photoelectric sensor, a direct reflection photoelectric sensor, a mirror reflection photoelectric sensor, a high frequency oscillation proximity sensor, a capacitive proximity sensor, a magnetic proximity sensor, an infrared proximity sensor, or the like. When the touch screen is capacitive, the proximity sensor may be configured to detect the proximity of the object with a change in electric field as an object with conductivity approaches. In this embodiment, the touch screen (or touch sensor) itself may be classified as the proximity sensor.

For convenience of explanation, an action that allows the object to be approached without contact on the touch screen and allows it to be recognized that the object is located on the touch screen is referred to as a "proximity touch," and an action that allows the object to be actually touched on the touch screen to be recognized is referred to a "contact touch." A position where the object is in close proximity touch on the touch screen refers to a position where the object is perpendicular to the touch screen when the object is in close proximity touch. The proximity sensor may detect a proximity touch and a proximity touch pattern (e.g., a proximity touch distance, a proximity touch direction, a proximity touch speed, a proximity touch time, a proximity touch position, a proximity touch movement state, or the like). As described above, the controller may process data (or information) corresponding to the proximity touch operation and the proximity touch pattern sensed by the proximity sensor, and further output visual information corresponding to the processed data on the touch screen. The controller may also control the display device such that different operations or data (or information) are processed depending on whether a touch on the same point on the touch screen is the proximity touch or the contact touch.

The touch sensor senses a touch (or a touch input) applied to the touch screen (or display) using at least one of various touch manners such as a resistive film type, a capacitive type, an infrared type, an ultrasonic type, a magnetic field type, or the like.

As an example, the touch sensor may be configured to convert a change in pressure applied to a specific portion of the touch screen or capacitance generated at a specific portion into an electrical input signal. The touch sensor may be configured to detect a position and an area at which a touch object contacts the touch screen, a pressure applied by the touch object, a capacitance of the touch, or the like. In an exemplary embodiment, the touch object is an object applying touch to the touch sensor and may be, for example, a finger, a touch pen, a stylus pen, a pointer, or the like.

When a touch input is received by the touch sensor, the corresponding signal(s) is sent to a touch controller. The touch controller processes the signal(s) and then transmits the corresponding data to the controller. As a result, the controller may determine which area of the display has been touched. In an exemplary embodiment, the touch controller may be a separate component from the controller or the touch controller and the controller may be the same component.

The controller may perform various controls depending on a type of touch object touching the touch screen and the sensed information concerning the touch event (e.g., a sensing of contact of a touch key provided on the touch screen). Depending on a current operation state of the display device or an application program, it may be determined whether to perform a different control or the same control based on the type of the touch object and the information concerning the touch event.

The touch sensor and the proximity sensor as described above may sense the touch of various different touch events, such as short (or tap) touch, long touch, multi touch, drag touch, flick touch, pinch-in touch, pinch-out touch, swipe touch, hovering touch to the touch screen, or the like, independently or in combination.

Hereinafter, for convenience of description, an exemplary embodiment in which the sensor TS has a structure of a mutual capacitance type will be described as an example. However, exemplary embodiments of the present inventive concepts are not limited thereto.

Figure 3:
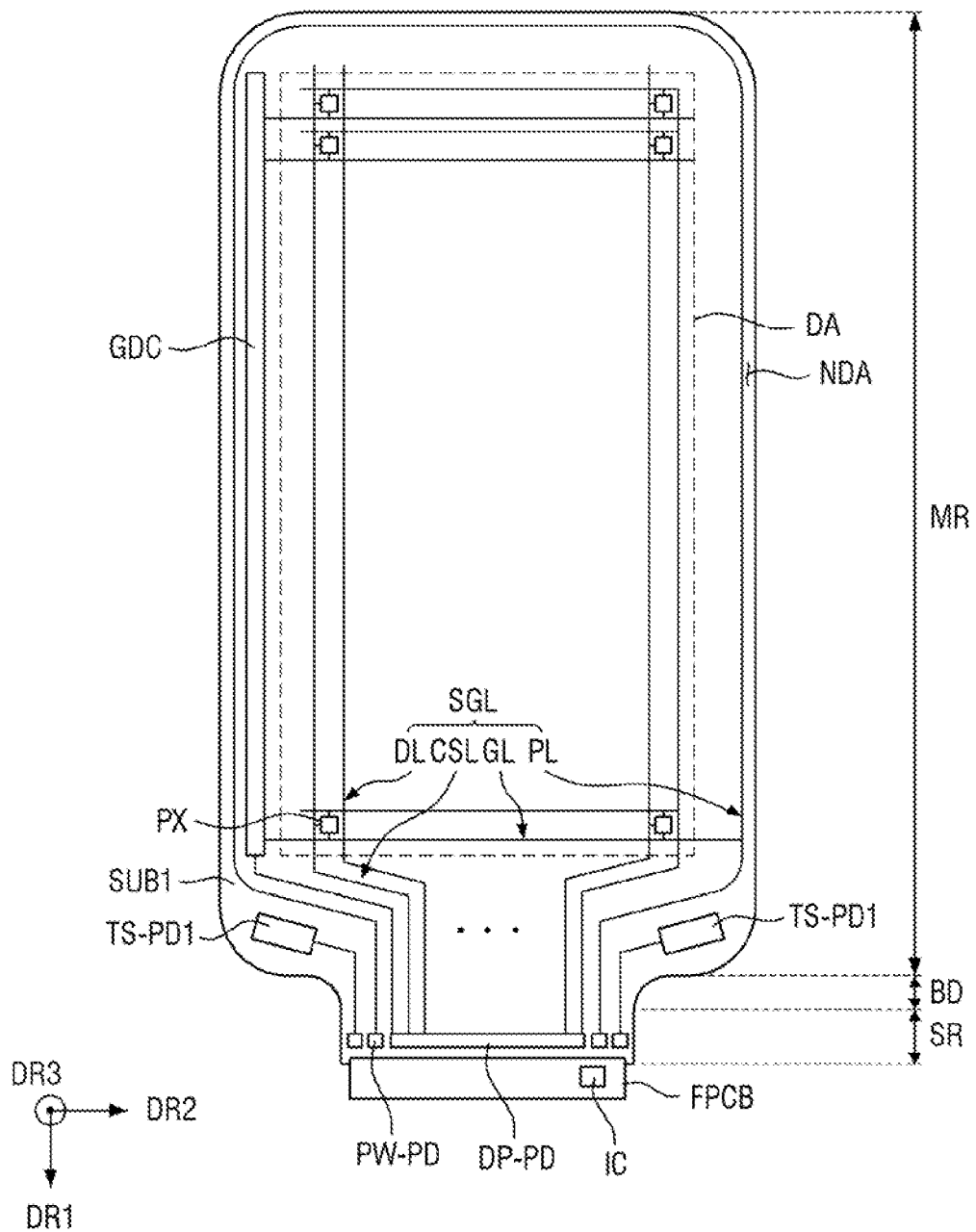
FIG. 3 is a top plan view of a first substrate included in a display device according to an exemplary embodiment of the present inventive concepts.
Figure 4A:
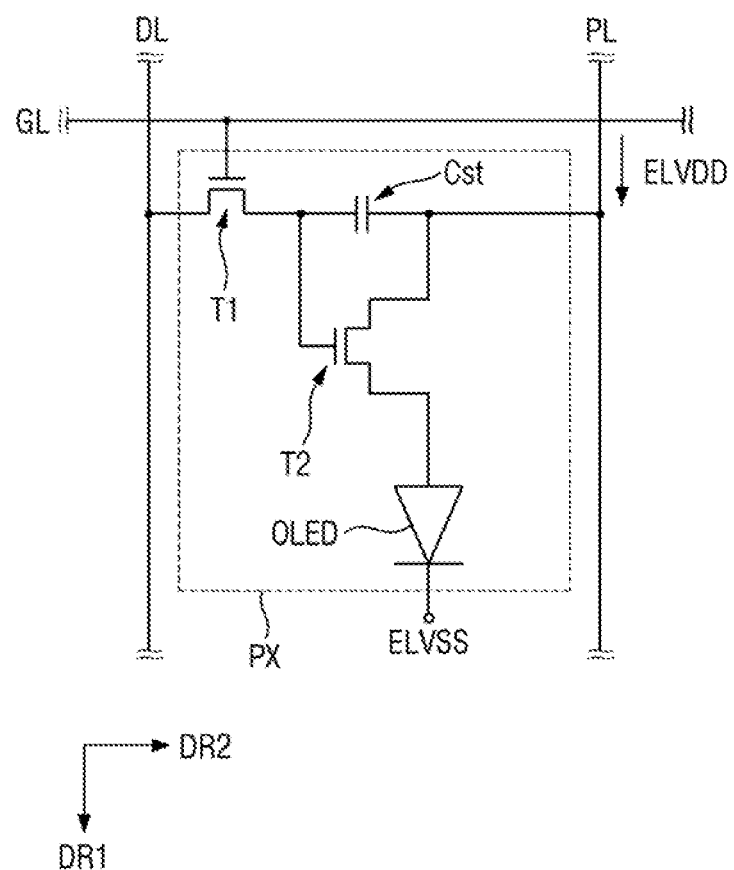
FIG. 4A is an equivalent circuit diagram of a pixel shown in FIG. 3 according to an exemplary embodiment of the present inventive concepts.
Figure 4B:
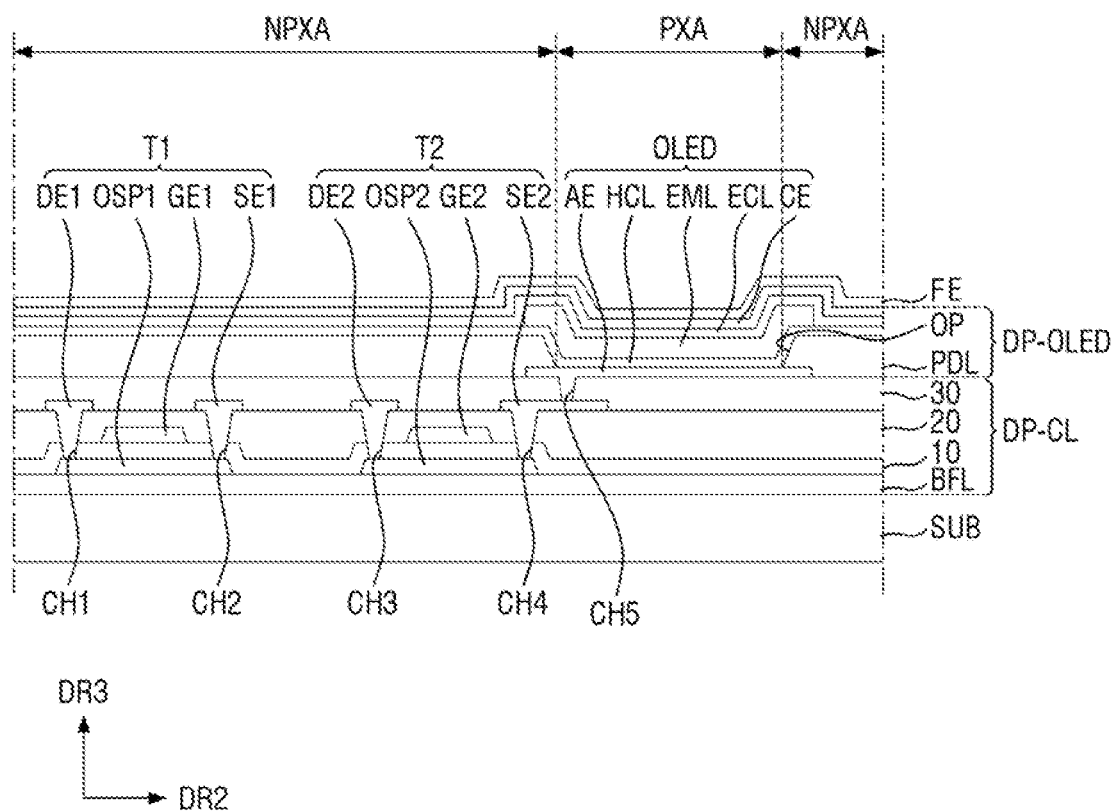
FIG. 4B is a schematic cross-sectional view of the pixel shown in FIG. 4A.

FIG. 3 is a top plan view of a first substrate included in a display device according to an exemplary embodiment of the present inventive concepts. FIG. 4A is an exemplary equivalent circuit diagram of a pixel shown in FIG. 3. FIG. 4B is a schematic cross-sectional view of the pixel shown in FIG. 4A.

Referring to FIGS. 3, 4A, and 4B, the first substrate SUB1 may include a main region MR having a display area DA and a non-display area NDA on a plane (e.g., in the first direction DR1 and second direction DR2). A bending area BD is connected to one side of the main region MR. A sub region SR overlaps with the main region MR in the third direction DR3 and is connected to the bending area BD.

In an exemplary embodiment of the present inventive concepts, the non-display area NDA may be defined along a border of the display area DA. The display area DA and the non-display area NDA of the display panel DP may correspond to the display area DM-DA and the non-display area DM-NDA of the display device 1 as shown in FIG. 1, respectively. However, exemplary embodiments of the present inventive concepts are not limited thereto and the display area DA and the non-display area NDA of the display panel DP may not correspond to the display area DM-DA and the non-display area DM-NDA of the display device 1. For example, the respective display area and non-display areas DA, NDA of the display panel DP and the display area DM-DA and the non-display area DM-NDA of the display device 1 may be changed depending on the structure/design of the display panel DP. In some exemplary embodiments of the present inventive concepts, the corners of the display area DA of the display panel DP may have a curved shape.

The bending area BD is connected to the main region MR. For example, as shown in the exemplary embodiment of FIG. 3, the main region MR has a generally rectangular shape having opposing relatively shorter sides and opposing relatively longer sides. The bending area BD may be disposed below one short side of the main region MR (e.g., in the first direction DR1). In an exemplary embodiment, a width of the bending area BD (e.g., length in the second direction DR2) may be smaller than a width of the adjacent relatively shorter side of the main region MR. In an exemplary embodiment, a connection portion between the main region MR and the bending area BD may have an L-shaped cutting shape.

In the bending area BD of the panel, the first substrate SUB1 may be bent with a curvature in a downward direction in the thickness direction (e.g., in the third direction DR3), in a direction opposite to the display surface. In an exemplary embodiment, the bending area BD may have a constant radius of curvature. However, exemplary embodiments of the present inventive concepts are not limited thereto, and the bending area BD may have a different radius of curvature for each section. As the first substrate SUB1 is bent in the bending area BD, the surface of the first substrate SUB1 is inverted. For example, a surface of the first substrate SUB1 facing an upper portion (e.g., in the third direction DR3) may be changed to face a lower portion (e.g., in the third direction DR3) through the bending area BD of the panel.

The sub region SR extends from the bending area BD. The sub region SR may extend from the bending area BD in a direction parallel to the main region MR. The sub region SR may overlap the main region MR in a thickness direction of the first substrate SUB1 (e.g., in the third direction DR3) when the bending area BD is fully bent. The sub region SR may overlap the non-display area NDA in the third direction DR3 at a lower edge (e.g., in the first direction DR1) of the main region MR, and may also overlap the display area DA of the main region MR in the third direction DR3.

A width of the sub region SR (e.g., length in the second direction DR2) may be the same as a width of the bending area BD. However, exemplary embodiments of the present inventive concepts are not limited thereto.

The display panel DP may include a driving circuit GDC, a plurality of signal lines SGL, and a plurality of pixels PX. The plurality of pixels PX are disposed in the display area DA. Each of the pixels PX may include a self-emitting light element (e.g., the organic light emitting diode) and a pixel driving circuit connected to the self-emitting light element. The driving circuit GDC, the plurality of signal lines SGL, and the pixel driving circuit may be included in the circuit element layer DP-CL shown in FIG. 2.

The driving circuit GDC may include at least one scan driving circuit. The driving circuit GDC generates a plurality of scan signals and, sequentially outputs the plurality of scan signals to a plurality of scan lines GL which will be described later. The scan driving circuit GDC may also output another control signal to the driving circuit of the pixels PX.

The driving circuit GDC may include a plurality of thin film transistors formed through the same process as the driving circuit of the pixels PX, such as a low-temperature polycrystaline silicon (LTPS) process or a low temperature polycrystalline oxide (LTPO) process. However, exemplary embodiments of the present inventive concepts are not limited thereto.

The plurality of signal lines SGL may include scan lines GL, data lines DL, a power line PL, and a control signal line CSL. The scan lines GL are respectively connected to the corresponding pixels PX of the plurality of pixels PX, and the data lines DL are respectively connected to the corresponding pixels PX of the plurality of pixels PX. The scan lines GL may extend in the second direction DR2 and may be arranged in the first direction DR1. The data lines DL may extend in the first direction DR1 and may be arranged in the second direction DR2. The power line PL is connected to the plurality of pixels PX. The control signal line CSL may provide control signals to the driving circuit CDC.

The display panel DP includes signal pads DP-PD and PW-PD connected to ends of the signal lines SGL. The signal pads DP-PD and PW-PD may be a type of circuit element. An area in which the signal pads DP-PD and PW-PD are disposed in the non-display area NDA may be defined herein as a pad area.

Lower sensing pads, such as first sensing pad parts TS-PD1 may also be disposed in the pad area of the non-display area NDA. The first sensing pad parts TS-PD1 are electrically connected to signal lines of the sensor TS and will be described later. In some exemplary embodiments of the present inventive concepts, the first sensing pad parts TS-PD1 may be formed through the same process as the signal lines SGL and may be disposed on the same layer as the signal lines SGL.

In some exemplary embodiments of the present inventive concepts, the first sensing pads TS-PD1 may be electrically insulated from the signal lines SGL of the display panel.

A display driving substrate FPCB (Flexible Printed Circuit Board) may be connected to the pad area. The display driving substrate FPCB may be a flexible printed circuit board or a film.

A chip mounting area may be defined in the display driving substrate FPCB, and a driving chip IC such as a timing control circuit in a chip form or the like may be mounted in the chip mounting area.

FIG. 4A illustrates any one of scan line GL, any one of data line DL, a power line PL, and a pixel PX connected thereto. However, the configuration of the pixel PX is not limited to the exemplary embodiment of FIG. 4A and may be implemented in a various different arrangements.

In an exemplary embodiment, the organic light emitting diode OLED may be a front light emitting diode or a back light emitting diode. The pixel PX includes a first transistor T1 (e.g., a switching transistor), a second transistor T2 (e.g., a driving transistor), and a capacitor Cst as a pixel driving circuit for driving the organic light emitting diode OLED. A first power supply voltage ELVDD is provided to the second transistor T2, and a second power supply voltage ELVSS is provided to the organic light emitting diode OLED. In an exemplary embodiment, the second power supply voltage ELVSS may be lower than the first power supply voltage ELVDD.

The first transistor T1 outputs a data signal applied to the data line DL in response to a scan signal applied to the scan line GL. The capacitor Cst charges a voltage corresponding to the data signal received from the first transistor T1. The second transistor T2 is connected to the organic light emitting diode OLED. The second transistor T2 controls driving current flowing through the organic light emitting diode OLED in response to an amount of charge stored in the capacitor Cst. While the first transistor T1 and the second transistor T2 are shown in the exemplary embodiment of FIG. 4A as being single gate electrodes, in other exemplary embodiments, at least one of the first transistor T1 and the second transistor T2 may be a dual gate electrode.

FIG. 4B illustrates a partial cross-sectional view of the display panel DP corresponding to the equivalent circuit shown in FIG. 4A.

The circuit element layer DP-CL, the display element layer DP-OLED, and the first layer FE are sequentially disposed on a base layer SUB (e.g., in the third direction DR3). In the exemplary embodiment of FIG. 4A, the circuit element layer DP-CL includes a buffer film BFL, a first intermediate inorganic layer 10, and a second intermediate inorganic layer 20. The circuit element layer DP-CL may further include an intermediate organic layer 30, which is an organic layer. A material of the inorganic layer and the organic layer is not particularly limited. Furthermore, in an exemplary embodiment of the present inventive concepts, the buffer film BFL may be selectively disposed on a various different layers or omitted altogether.

A semiconductor pattern OSP1 (hereinafter, a first semiconductor pattern) of the first transistor T1 and a semiconductor pattern OSP2 (hereinafter, a second semiconductor pattern) of the second transistor T2 are disposed on the buffer film BFL. For example, the first semiconductor pattern OSP1 and second semiconductor pattern OSP2 may be disposed directly on the buffer film BFL (e.g., in the third direction DR3). In an exemplary embodiment, the first semiconductor pattern OSP1 and the second semiconductor pattern OSP2 may be selected from amorphous silicon, polysilicon, and metal oxide semiconductors. However, exemplary embodiments of the present inventive concepts are not limited thereto.

A first intermediate inorganic layer 10 is disposed on (e.g., directly on in the third direction DR3) the first semiconductor pattern OSP1 and the second semiconductor pattern OSP2. A control electrode GE1 (hereinafter, first control electrode) of the first transistor T1 and a control electrode GE2 (hereinafter, a second control electrode) of the second transistor T2 are disposed on (e.g., directly on in the third direction DR3) the first intermediate inorganic layer 10. The first control electrode GE1 and the second control electrode GE2 may be manufactured according to the same photolithography process as the scan lines GL (see FIG. 3).

A second intermediate inorganic layer 20 covering the first control electrode GE1 and the second control electrode GE2 is disposed on (e.g., directly on in the third direction DR3) the first intermediate inorganic layer 10. An input electrode SE1 (hereinafter, a first input electrode) and an output electrode DE1 (hereinafter, a first output electrode) of the first transistor T1, and an input electrode SE2 (hereinafter, a second input electrode) and an output electrode DE2 (second output electrode) of the second transistor T2 are disposed on the second intermediate inorganic layer 20 (e.g., directly on in the third direction DR3).

The first input electrode SE1 and the first output electrode DE1 are connected to the first semiconductor pattern OSP1 through a first through hole CH1 and a second through hole CH2, penetrating both the first intermediate inorganic layer 10 and the second intermediate inorganic layer 20, respectively. The second input electrode SE2 and the second output electrode DE2 are connected to the second semiconductor pattern OSP2 through a third through hole CH3 and a fourth through hole CH4 penetrating both the first intermediate inorganic layer 10 and the second intermediate inorganic layer 20, respectively. While the exemplary embodiment of FIG. 4 shows a top gate structure for the first transistor T1 and the second transistor T2, in another exemplary embodiment of the present inventive concepts, at least one of the first transistor T1 and the second transistor T2 may be modified to have a bottom gate structure.

The intermediate organic layer 30 covering the first input electrode SE1, the second input electrode SE2, the first output electrode DE1, and the second output electrode DE2 is disposed on (e.g., directly on in the third direction DR3) the second intermediate inorganic layer 20. The intermediate organic layer may have a planarization function and provide a flat surface (e.g., an upper surface extending in the second direction DR2).

The display element layer DP-OLED is disposed on the intermediate organic layer 30. The display element layer DP-OLED may include a pixel defining layer PDL and the organic light emitting diode OLED. The pixel defining layer PDL may include an organic material. A first electrode AE is disposed on the intermediate organic layer 30. The first electrode AE is connected to the second output electrode DE2 through a fifth through hole CH5 penetrating the intermediate organic layer 30. An opening OP is defined in the pixel defining layer PDL. The opening OP of the pixel defining layer PDL exposes at least a portion of the first electrode AE. In an exemplary embodiment of the present inventive concepts, the pixel defining layer PDL may be omitted.

The pixel PX may be disposed in the display area DP-DA. The display area DP-DA may include a light emitting area PXA and a non-light emitting area NPXA adjacent to the light emitting area PXA). The non-light emitting area NPXA may surround the light emitting area PXA (e.g., in the first direction DR1 and/or second direction DR2). In an exemplary embodiment of the present inventive concepts, the light emitting area PXA is defined to correspond to a partial area of the first electrode AE exposed by the opening OP of the pixel defining layer PDL.

In an exemplary embodiment of the present inventive concepts, the light emitting area PXA may overlap at least one of the first and second transistors T1 and T2 (e.g., in the third direction DR3). The opening OP may be wider, and the first electrode AE and a light emitting layer EML described later may also be wider.

A hole control layer HCL may be disposed in common in the light emitting area PXA and the non-light emitting area NPXA. A common layer such as the hole control layer HCL may be commonly formed in the pixels PX (see FIG. 3).

The light emitting layer EML is disposed on the hole control layer HCL (e.g., disposed directly on the hole control layer HCL in the third direction DR3). The light emitting layer EML may be disposed in an area corresponding to the opening OP. The light emitting layer EML may be formed separately from each of the pixels PX. The light emitting layer EML may include an organic material and/or an inorganic material. The light emitting layer EML may generate predetermined color light.

Although the light emitting layer EML is patterned in the exemplary embodiment of FIG. 4B, in other exemplary embodiments the light emitting layer EML may be commonly disposed in the pixels PX. In an exemplary embodiment, the light emitting layer EML may generate white light. Further, the light emitting layer EML may have a multilayer structure.

An electronic control layer ECL is disposed on the light emitting layer EML (e.g., directly on in the third direction DR3). Although not separately illustrated, the electronic control layer ECL may be commonly formed in the pixels PX (see FIG. 3). A second electrode CE is disposed on the electronic control layer ECL (e.g., directly on in the third direction DR3). The second electrode CE is commonly disposed in the pixels PX.

The first layer FE is disposed on the second electrode CE (e.g., directly on in the third direction DR3). The first layer FE is commonly disposed in the pixels PX. In an exemplary embodiment of the present inventive concepts, the first layer FE directly covers the second electrode CE.

In some exemplary embodiments of the present inventive concepts, the first layer FE is made of at least one compound selected from silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

However, the structure of the first layer FE is not limited to the above-described example, and the stacked structure of the first layer FE may be variously changed.

In an exemplary embodiment of the present inventive concepts, the organic light emitting diode OLED may further include a resonance structure for controlling a resonance distance of light generated in the light emitting layer EML. The resonant structure may be disposed between the first electrode AE and the second electrode CE, and a thickness of the resonant structure may be determined depending on a wavelength of the light generated in the light emitting layer EML.

In FIGS. 4A and 4B, the pixel PX includes two thin film transistors and one storage capacitor. However, exemplary embodiments of the present inventive concepts are not limited thereto. For example, as shown in the exemplary embodiment of FIG. 5, the pixel PX may include seven thin film transistors and one storage capacitor.

Figure 5:
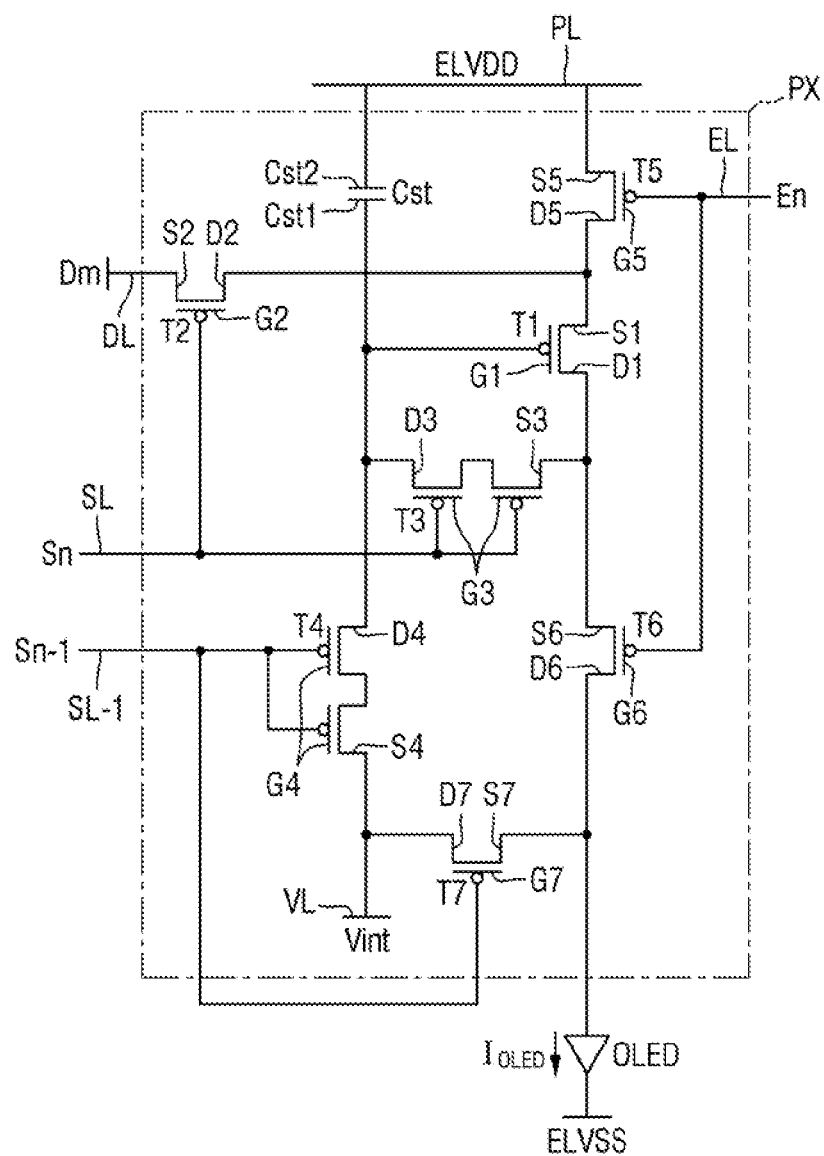
FIG. 5 is an equivalent circuit diagram according to an exemplary embodiment of the present inventive concepts.

Referring to FIG. 5, the pixel PX may include a plurality of thin film transistors and a storage capacitor. The thin film transistors and the storage capacitor may be connected to signal lines SL, SL-1, EL, and DL, an initialization voltage line VL, and a driving voltage line PL.

In the exemplary embodiment of FIG. 5, each pixel PX is connected to the signal lines SL, SL-1, EL, and DL, the initialization voltage line VL, and the driving voltage line PL. However, exemplary embodiments of the present inventive concepts are not limited thereto. For example, in another exemplary embodiment of the present inventive concepts, at least one of the signal lines SL, SL-1, EL, and DL, the initialization voltage line VL, the driving voltage line PL, or the like may be shared by neighboring pixels.

In an exemplary embodiment, the plurality of thin film transistors may include a driving thin film transistor (driving TFT) T1, a switching thin film transistor (switching TFT) T2, a compensation thin film transistor T3, a first initialization thin film transistor T4, an operation control thin film transistor T5, a light emission control thin film transistor T6, and the second initialization thin film transistor T7.

The signal line includes a scan line SL for transferring a scan signal Sn to the switching thin film transistor T2 and the compensation thin film transistor T3, a previous scan line SL-1 for transferring a previous scan signal Sn-1 to the first initialization thin film transistor T4 and the second initialization thin film transistor T7, a light emission control line EL for transferring a light emission control signal En to the operation control thin film transistor T5 and the light emission control thin film transistor T6, and a data line DL for intersecting the scan line SL and transferring a data signal Dm. The driving voltage line PL transfers a driving voltage ELVDD to the driving thin film transistor T. The initialization voltage line VL transfers an initialization voltage Vint for initializing the driving thin film transistor T1 and a pixel electrode.

A driving gate electrode G1 of the driving thin film transistor T1 is connected to a first storage capacitor plate Cst1 of the storage capacitor Cst. A driving source electrode S1 of the driving thin film transistor T1 is connected to a lower driving voltage line PL via the operation control thin film transistor T5. A driving drain electrode D1 of the driving thin film transistor T1 is electrically connected to the pixel electrode of a main organic light emitting diode OLED via the light emission control thin film transistor T6. The driving thin film transistor T1 receives the data signal Dm depending on a switching operation of the switching thin film transistor T2 and supplies driving current IOLED to the main organic light emitting diode OLED.

A switching gate electrode G2 of the switching thin film transistor T2 is connected to the scan line SL. A switching source electrode S2 of the switching thin film transistor T2 is connected to the data line DL. A switching drain electrode D2 of the switching thin film transistor T2 is connected to the driving source electrode S1 of the driving thin film transistor T1 and is connected to the lower driving voltage line PL via the operation control thin film transistor T5. The switching thin film transistor T2 is turned on according to the scan signal Sn received through the scan line SL, and performs a switching operation of transferring the data signal Dm transferred to the data line DL to the driving source electrode S1 of the driving thin film transistor T1.

The compensation gate electrode G3 of the compensation thin film transistor T3 is connected to the scan line SL. A compensation source electrode S3 of the compensation thin film transistor T3 is connected to the driving drain electrode D1 of the driving thin film transistor T1 and is connected to the pixel electrode of the organic light emitting diode OLED via the light emission control thin film transistor T6. A compensation drain electrode D3 of the compensation thin film transistor T3 is connected to the first storage capacitor plate Cst1 of the storage capacitor Cst, a first initialization drain electrode D4 of the first initialization thin film transistor T4, and a driving gate electrode G1 of the driving thin film transistor T1. The compensation thin film transistor T3 is turned on according to the scan signal Sn received through the scan line SL, and electrically connects the driving gate electrode G1 and the driving drain electrode D1 of the driving thin film transistor T1 to diode-connect the driving thin film transistor T1.

A first initialization gate electrode G4 of the first initialization thin film transistor T4 is connected to the previous scan line SL-1. A first initialization source electrode S4 of the first initialization thin film transistor T4 is connected to a second initialization drain electrode D7 of the second initialization thin film transistor T7 and the initialization voltage line VL. The first initialization drain electrode D4 of the first initialization thin film transistor T4 is connected the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on according to the previous scan signal Sn-1 received through the previous scan line SL-1. The first initialization thin film transistor T4 is turned on and transfers the initialization voltage Vint to the driving gate electrode G1 of the driving thin film transistor T1 and performs an initialization operation of initializing a voltage of the driving gate electrode G1 of the driving thin film transistor T1.

An operation control gate electrode G5 of the operation control thin film transistor T5 is connected to the emission control line EL. An operation control source electrode S5 of the operation control thin film transistor T5 is connected to the lower driving voltage line PL. An operation control drain electrode D5 of the operation control thin film transistor T5 is connected to the driving source electrode S1 of the driving thin film transistor T1 and the switching drain electrode D2 of the switching thin film transistor T2.

A light emission control gate electrode G6 of the light emission control thin film transistor T6 is connected to the light emission control line EL. An emission control source electrode S6 of the emission control thin film transistor T6 is connected to the driving drain electrode D1 of the driving thin film transistor T1 and the compensation source electrode S3 of the compensation thin film transistor T3. An emission control drain electrode D6 of the emission control thin film transistor T6 is electrically connected to a second initialization source electrode S7 of the second initialization thin film transistor T7 and the pixel electrode of the organic light emitting diode OLED.

The operation control thin film transistor T5 and the emission control thin film transistor T6 are turned on at the same time according to the emission control signal En received through the emission control line EL, and transfer the driving voltage ELVDD to the main organic light emitting diode OLED so that the driving current IOLED flows in the organic light emitting diode OLED.

The second initialization gate electrode G7 of the second initialization thin film transistor T7 is connected to the previous scan line SL-1. The second initialization source electrode S7 of the second initialization thin film transistor T7 is connected to the emission control drain electrode D6 of the emission control thin film transistor T6 and the pixel electrode of the main organic light emitting diode OLED. The second initialization drain electrode D7 of the second initialization thin film transistor T7 is connected to the first initialization source electrode S4 of the first initialization thin film transistor T4 and the initialization voltage line VL. The second initialization thin film transistor T7 is turned on according to the previous scan signal Sn-1 received through the previous scan line SL-1 to initialize the pixel electrode of the main organic light emitting diode OLED.

Although the exemplary embodiment of FIG. 5 illustrates a pixel PX in which the first initialization thin film transistor T4 and the second initialization thin film transistor T7 are connected to the previous scan line SL-1, exemplary embodiments of the present inventive concepts are not limited thereto. For example, in another exemplary embodiment of the present inventive concepts, the first initialization thin film transistor T4 may be connected to the previous scan line SL-1 and driven according to the previous scan signal Sn-1, and the second initialization thin film transistor T7 may be connected to a separate signal line (for example, a scan line) and driven according to a signal transferred to the signal line. However, in other exemplary embodiments, the pixel PX may be variously arranged.

The second storage capacitor plate Cst2 of the storage capacitor Cst is connected to the driving voltage line PL. An opposite electrode of the organic light emitting diode OLED is connected to a common voltage ELVSS. Accordingly, the organic light emitting diode OLED may receive the driving current IOLED from the driving thin film transistor T1 and emit light, thereby displaying an image.

Although the exemplary embodiment of FIG. 5 illustrates that the compensation thin film transistor T3 and the first initialization thin film transistor T4 have dual gate electrodes, in other exemplary embodiments, the compensation thin film transistor T3 and the first initialization thin film transistor T4 may have one gate electrode.

Figure 6:
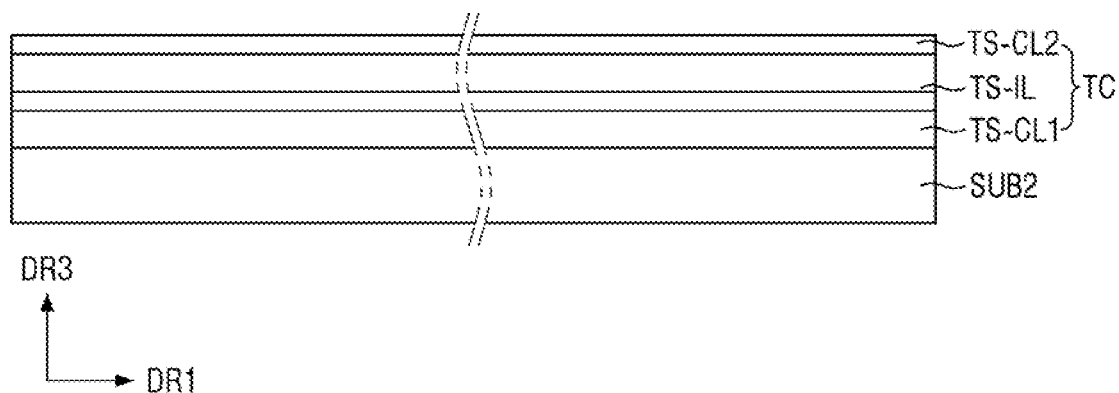
FIG. 6 is a cross-sectional view of a second substrate including a sensing sensor according to an exemplary embodiment of the present inventive concepts.
Figure 7:
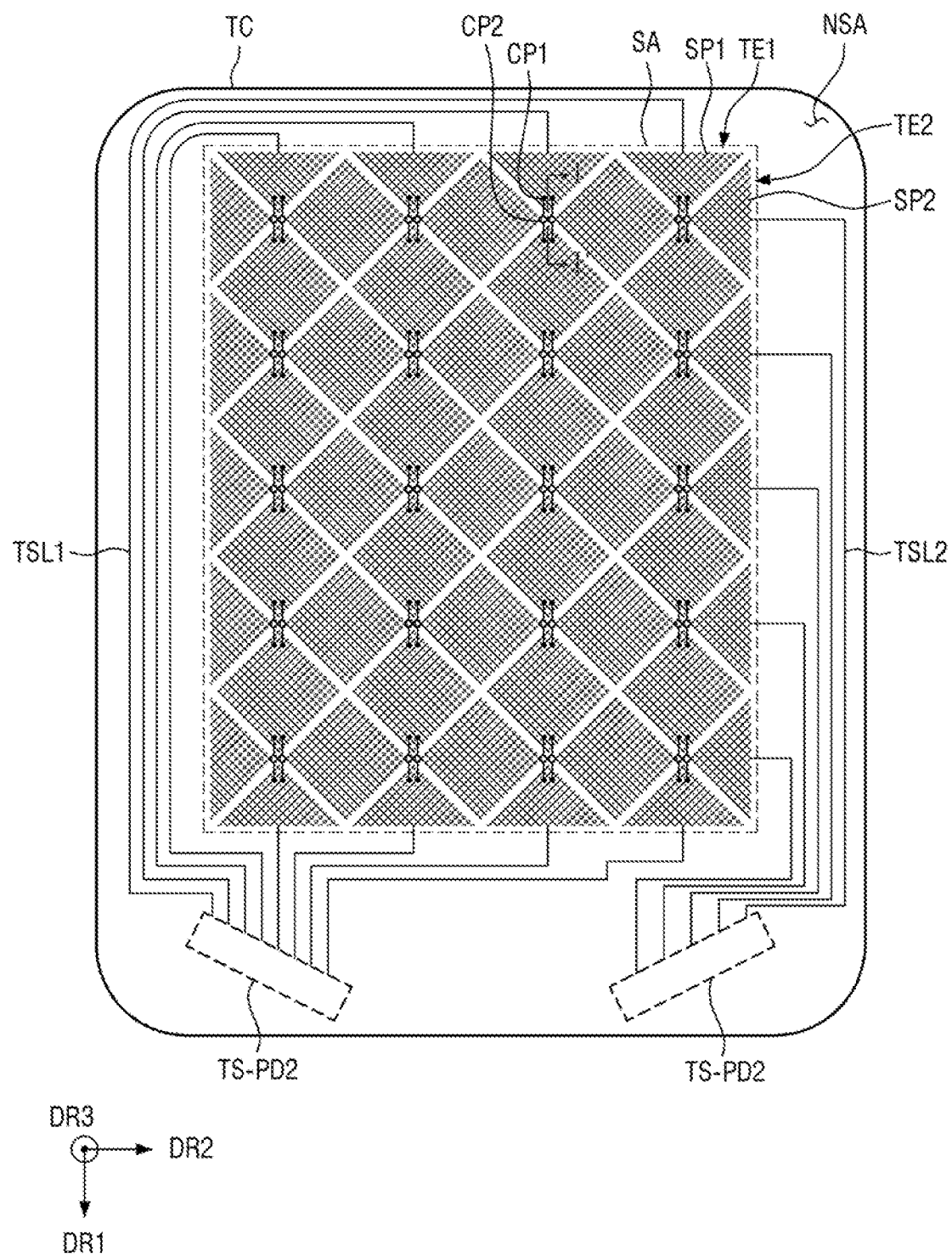
FIG. 7 is a top plan view of a sensing sensor according to an exemplary embodiment of the present inventive concepts.
Figure 8:
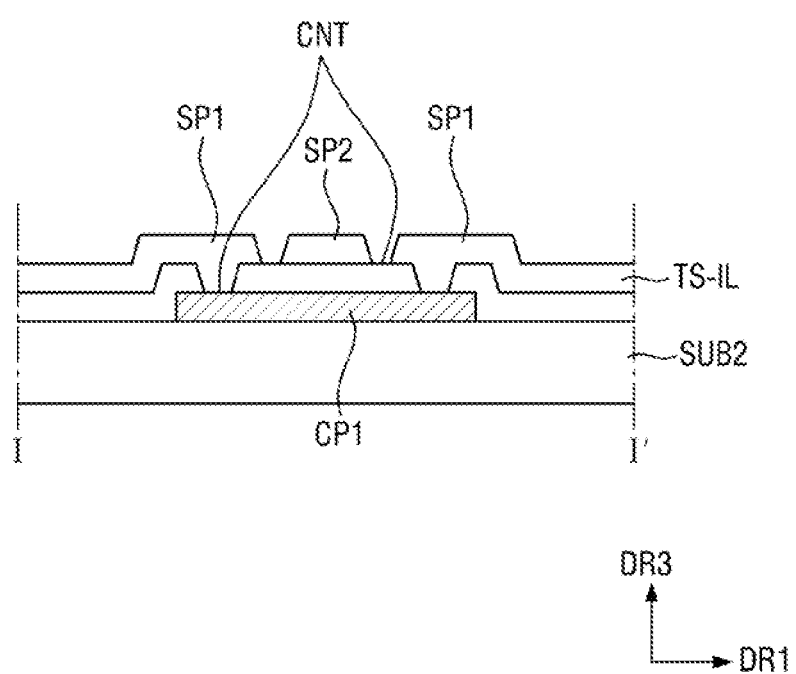
FIG. 8 is a cross-sectional view of a sensing sensor according to an exemplary embodiment of the present inventive concepts.

FIG. 6 is a cross-sectional view of a second substrate SUB2 including a sensing sensor according to an exemplary embodiment of the present inventive concepts. FIG. 7 is a top plan view of a sensor according to an exemplary embodiment of the present inventive concepts. FIG. 8 is a cross-sectional view of a sensor according to an exemplary embodiment of the present inventive concepts. Referring to the exemplary embodiment of FIG. 6, the sensing element layer TC includes a first conductive layer TS-CL1, an insulating layer TS-IL (hereinafter, a sensing insulating layer), and a second conductive layer TS-CL2. The first conductive layer TS-CL1 may be directly disposed on the second substrate SUB2 (e.g., in the third direction DR3). However, exemplary embodiments of the present inventive concepts are not limited thereto. For example, in other exemplary embodiments, a buffer layer may be disposed directly on the second substrate SUB2 and the first conductive layer TS-CL1 may be disposed directly on the buffer layer (e.g., in the third direction DR3). In an exemplary embodiment, the buffer layer may include the inorganic layer or the organic layer.

Each of the first conductive layer TS-CL1 and the second conductive layer TS-CL2 may have a single layer structure, or may have a multilayer structure (e.g., stacked in the third direction DR3). The conductive layer having the multilayer structure may include at least two of the transparent conductive layers and metal layers. The conductive layer having the multilayer structure may include metal layers including different metals. In an exemplary embodiment, the transparent conductive layer may include at least one compound selected from indium tin oxide (ITO), indium zinc oxide (IZO), zinc oxide (ZnO), indium tin zinc oxide (ITZO), PEDOT, metal nanowires, graphene, or the like. The metal layer may include at least one compound selected from molybdenum, silver, titanium, copper, aluminum, and alloys thereof.

Each of the first conductive layer TS-CL1 and the second conductive layer TS-CL2 includes a plurality of patterns. Hereinafter, it is described that the first conductive layer TS-CL1 includes first conductive patterns, and the second conductive layer TS-CL2 includes second conductive patterns. Each of the first conductive patterns and the second conductive patterns may include sensing electrodes and sensing signal lines.

A sensing insulation layer TS-IL may include the inorganic material or the organic material. The sensing insulation layer TS-IL may be disposed between the first conductive layer TS-CL1 and the second conductive layer TS-CL2 (e.g., in the third direction DR3). In an exemplary embodiment, the inorganic material may include at least one of aluminum oxide, titanium oxide, silicon oxide silicon oxynitride, zirconium oxide, and hafnium oxide. The organic material may include at least one of acrylic resin, methacryl resin, polyisoprene, vinyl resin, epoxy resin, urethane resin, cellulose resin, siloxane resin, polyimide resin, polyamide resin, and perylene resin.

The sensing insulation layer TS-IL may have a single layer or a mulilayer structure. The sensing insulation layer TS-IL may have at least one of an inorganic layer and an organic layer. In an exemplary embodiment, the inorganic layer and the organic layer may be formed by chemical vapor deposition.

The sensing insulating layer TS-IL insulates the first conductive layer TS-CL1 and the second conductive layer TS-CL2 from each other. The sensing insulating layer TS-IL may have a variety of shapes and is not limited to the shape shown in the exemplary embodiment of FIG. 6. For example, the shape of the sensing insulating layer TS-IL may be changed depending on shapes of the first conductive patterns and the second conductive patterns. The sensing insulating layer TS-IL may cover the entire second substrate SUB2 or may include a plurality of discrete insulating patterns. The plurality of insulating patterns may overlap first connection parts CP1 or second connection parts CP2 (which will be described later) to provide sufficient insulation.

In the exemplary embodiment shown in FIG. 6, a two-layer sensing element layer is exemplarily illustrated. However, exemplary embodiments of the present inventive concepts are not limited thereto. For example, in another exemplary embodiment, a single layer sensing element layer may be provided which includes a conductive layer and an insulating layer covering the conductive layer. The conductive layer includes sensors and sensing signal lines connected to the sensors. In an exemplary embodiment, the single layer sensing element layer may acquire coordinate information by a self-cap method.

Referring to FIG. 7, the sensing element layer TC includes first sensing electrodes TE1, first sensing signal lines TSL1 connected to the first sensing electrodes TE1, second sensing electrodes TE2, second sensing signal lines TSL2 connected to the second sensing electrodes TE1, and second sensing pad parts TS-PD2 connected to the first and second sensing signal lines TSL1 and TSL2. The first sensing electrodes TE1, the second sensing electrodes TE2, and the first and second sensing signal lines TSL1 and TSL2 are disposed in a sensing area SA on a plane (e.g., in the first direction DR1 and second direction DR2), and the second sensing pad parts TS-PD2 are disposed in a peripheral area NSA.

The sensing area SA may be an area that includes the sensors TS for detecting a touch input and the peripheral area NSA may be an area that does not include the sensors TS for sensing a touch input. In some exemplary embodiments of the present inventive concepts, the peripheral area NSA may be defined along a border of the sensing area SA. For example, as shown in the exemplary embodiment of FIG. 7, the peripheral area NSA may be included on all four sides surrounding the rectangular-shaped sensing area SA. However, exemplary embodiments of the present inventive concepts are not limited thereto. In an exemplary embodiment, the sensing area SA and the peripheral area NSA may correspond to the display area DM-DA and the non-display area DM-NDA of the display device 1 shown in FIG. 1. Alternatively, the sensing area SA and the peripheral area NSA may correspond to the display area DA and the non-display area NDA of the display panel DP shown in FIG. 3. In some exemplary embodiments of the present inventive concepts, the sensing area SA may be substantially the same as the display area DA of the display panel DP.

Each of the first sensing electrodes TE1 may have a mesh shape in which a plurality of sensing openings are defined. The first sensing electrodes TE1 extend in the first direction DR1 and are arranged in the second direction DR2. Each of the first sensing electrodes TE1 may include a plurality of first sensing sensor parts SP1 and a plurality of first connection parts CPL. The first sensing sensor parts SP1 of each first sensing electrode TE1 are arranged in the first direction DR1.

The first sensing sensor parts SP1 may be connected to adjacent first sensing sensor parts SP1 in the first direction DR1 through the first connection part CP1.

In an exemplary embodiment, the first sensing signal lines TSL1 may also have the mesh shape.

The second sensing electrodes TE2 insulate and intersect the first sensing electrodes TE1. Each of the second sensing electrodes TE2 may have a mesh shape in which a plurality of sensing openings are defined. The second sensing electrodes TE2 extend in the second direction DR2 and are arranged in the first direction DR1. Each of the second sensing electrodes TE2 includes a plurality of second sensing sensor parts SP2 and a plurality of second connection parts CP2. The second sensing sensor parts SP2 are arranged in the second direction DR2.

The second sensing sensor parts SP2 may be connected to adjacent second sensing sensor parts SP2 in the second direction DR2 through the second connection part CP2.

In an exemplary embodiment, the second sensing signal lines TSL2 may also have the mesh shape.

The first sensing electrodes TE1 and the second sensing electrodes TE2 are alternately disposed without overlapping each other. The first sensing electrodes TE1 and the second sensing electrodes TE2 are electrostatically coupled. As sensing signals are applied to the first sensing electrodes TE1, capacitors are formed between the first sensing sensor parts SP1 and the second sensing sensor parts SP2.

The first connection parts CP1 may be formed by patterning the first conductive layer TS-CL) shown in FIG. 6, and the first sensing sensor parts SP, the second sensing sensor parts SP2, the second connection parts CP2, the first sensing signal lines SL1, and the second sensing signal lines (SL2) may be formed by patterning the second conductive layer TS-CL2 shown in FIG. 6. As shown in the exemplary embodiment of FIG. 8, a contact hole CNT penetrating the sensing insulating layer TS-IL shown in FIG. 8 may be formed to electrically connect conductive patterns disposed on the other layer. However, exemplary embodiments of the present inventive concepts are not limited thereto and the first sensing sensor parts SP1, second sensing sensor parts SP2, first connection parts CP1 and second connection parts CP2 may have various different arrangements.

Figure 9:
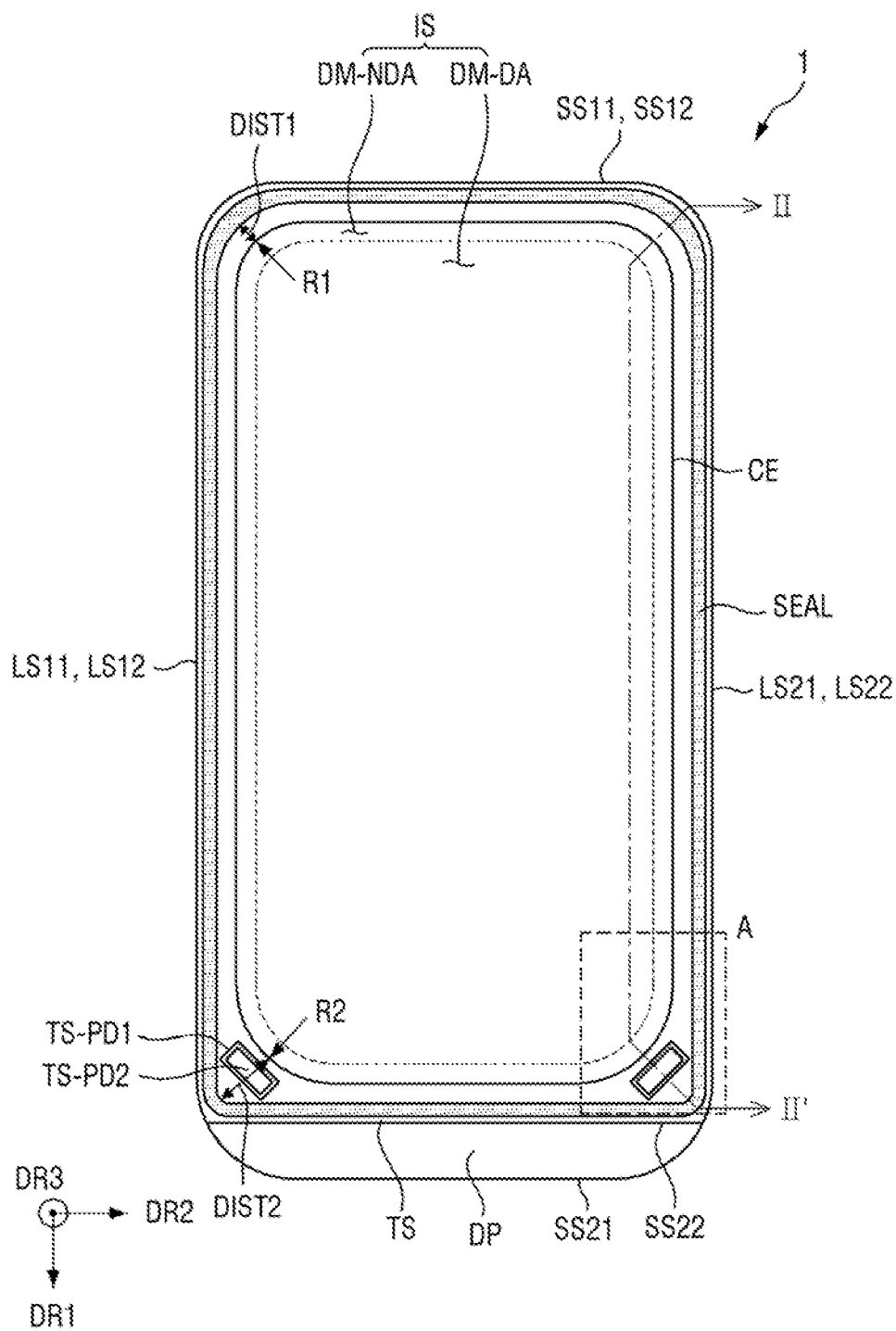
FIG. 9 is a top plan view of a display device according to an exemplary embodiment of the present inventive concepts.
Figure 10:
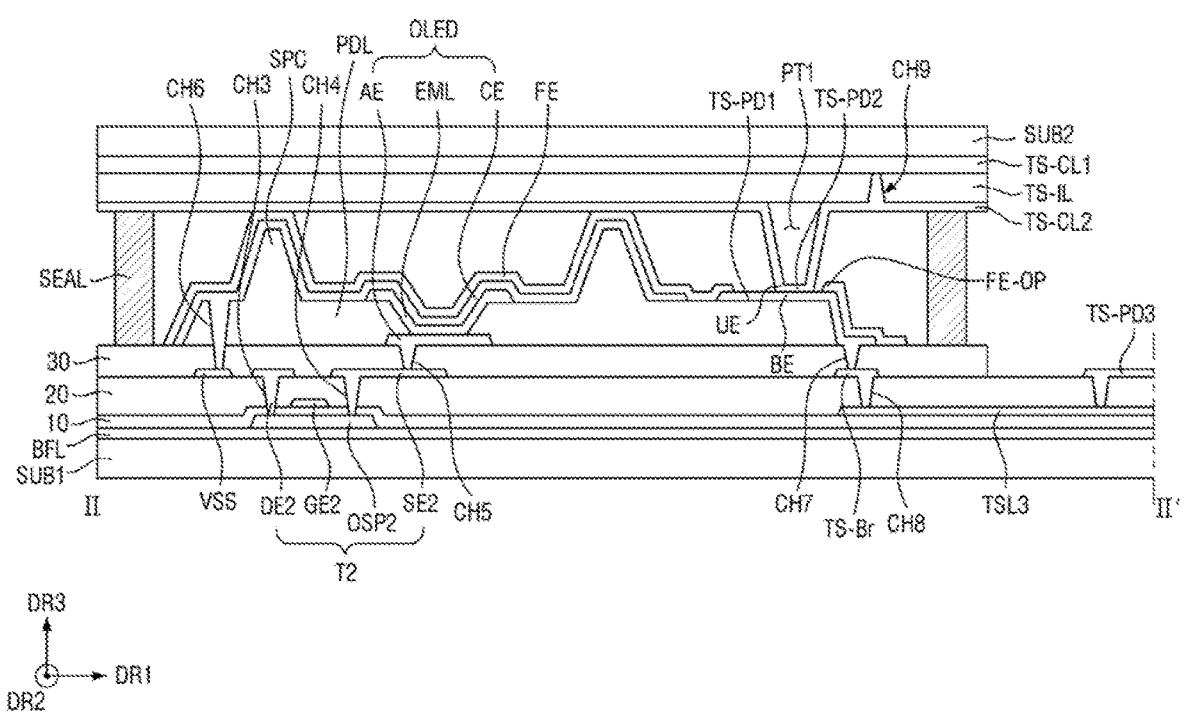
FIG. 10 is a cross-sectional view taken along line II-II' of FIG. 9 according to an exemplary embodiment of the present inventive concepts.
Figure 11:
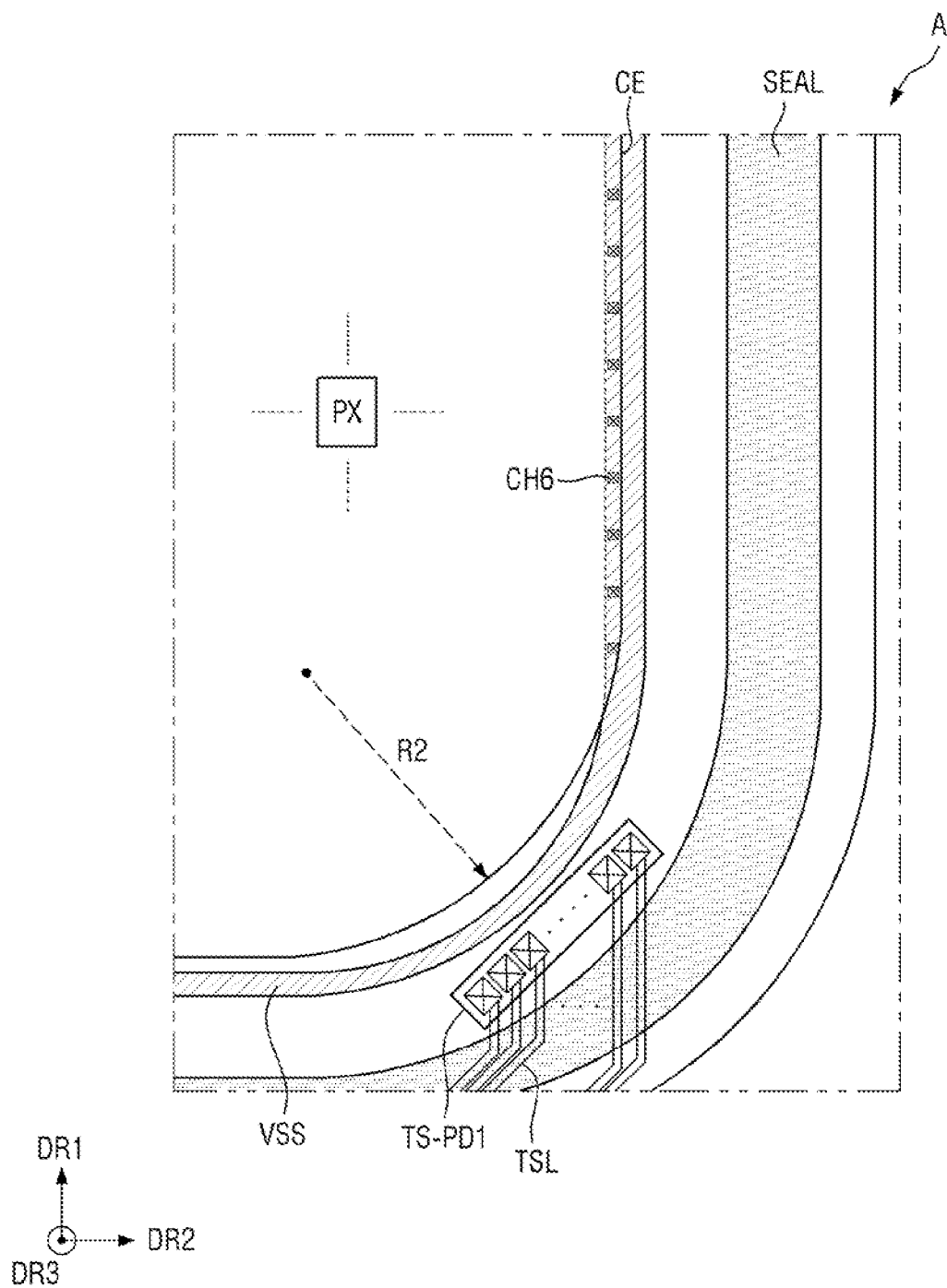
FIG. 11 is an enlarged view of portion A of FIG. 9 showing a first substrate according to an exemplary embodiment of the present inventive concepts.
Figure 12:
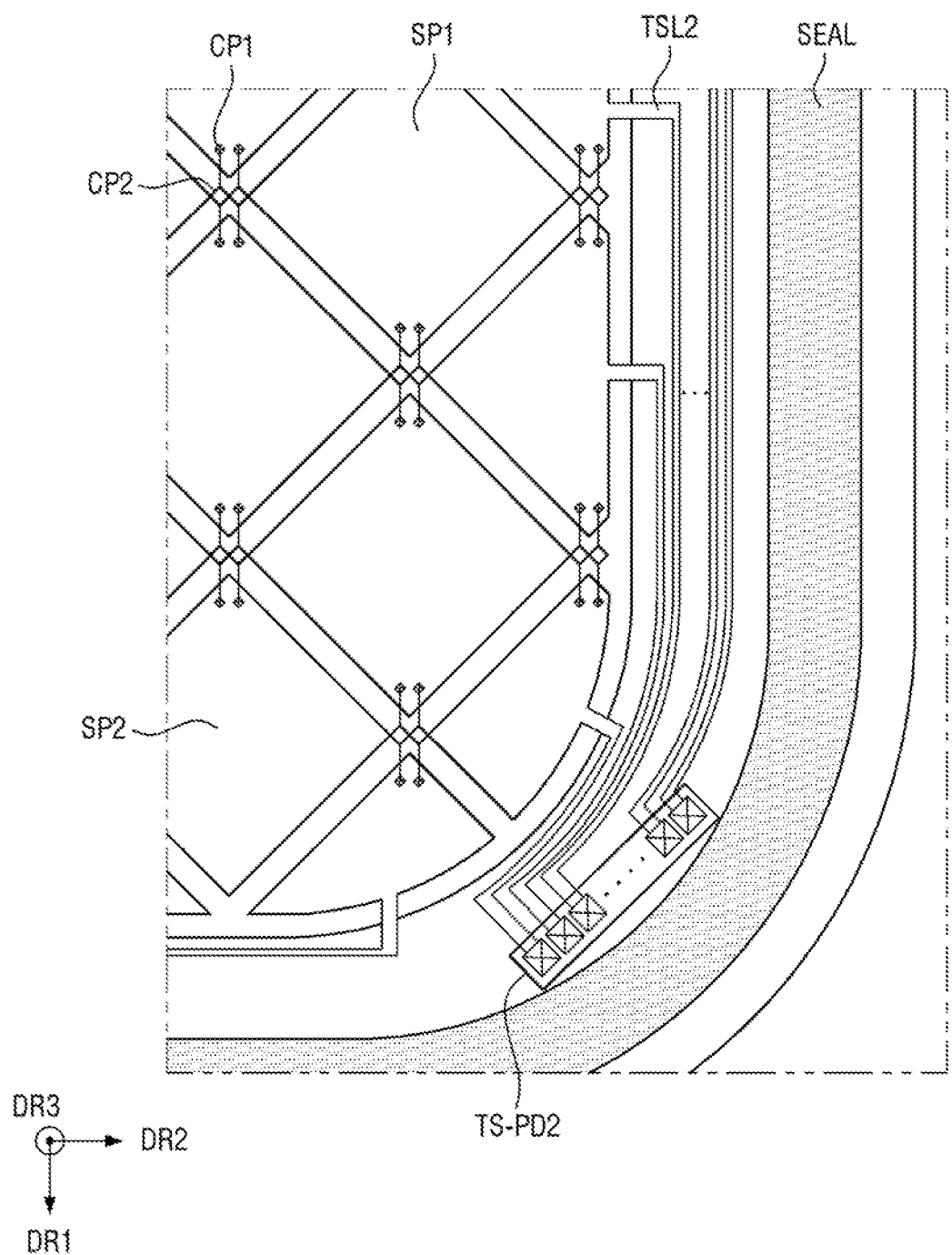
FIG. 12 is an enlarged view of portion A of FIG. 9 showing a second substrate according to an exemplary embodiment of the present inventive concepts.

FIG. 9 is a top plan view of a display device according to an exemplary embodiment of the present inventive concepts. FIG. 10 is a cross-sectional view taken along line II-II' of FIG. 9. FIG. 11 is an enlarged view of portion A of FIG. 9 showing a first substrate according to an exemplary embodiment of the present inventive concepts. FIG. 12 is an enlarged view of portion A of FIG. 9 showing a second substrate according to an exemplary embodiment of the present inventive concepts.

Referring to FIGS. 9 to 12, in the display device 1, the first substrate SUB1 and the second substrate SUB2 may overlap each other in the third direction DR3 and may be disposed to face each other. As shown in the exemplary embodiment of FIG. 9, the first substrate SUB1 and the second substrate SUB2 may have a rectangular shape. The first substrate SUB1 includes an upper short side SS11, a left long side LS11, a right long side LS21 and a lower short side SS21. The second substrate may include an upper short side SS12, a left long side LS12, a right long side LS22 and a lower short side SS22. As shown in the exemplary embodiment of FIG. 9, the upper short sides SS11, SS12, the left long sides LS11, LS12 and the right long sides LS21, LS22 of the first substrate SUB1 and second substrate SUB2, may be respectively aligned with each other. For example, edge portions of the upper short sides SS11, SS12 of the first and second substrates may overlap with each other (e.g., in the third direction DR3). Edge portions of the left long sides LS11, LS12 of the first substrate SUB1 and second substrate SUB2 may overlap with each other (e.g., in the third direction DR3). Edge portions of the right long sides LS21, LS22 of the first substrate SUB1 and second substrate SUB2 may overlap with each other (e.g., in the third direction DR3).

As shown in the exemplary embodiment of FIG. 9, the lower short side SS21 of the first substrate SUB1 may extend (e.g., protrude) further in the first direction DR1 than the lower short side SS22 of the second substrate SUB2 and may not be aligned with the lower short side SS22 of the second substrate SUB2.

While the exemplary embodiment of FIG. 9 shows the lower short side SS21 of the first substrate SUB1 protruding relative to the lower short side SS22 of the second substrate SUB2, exemplary embodiments of the present inventive concepts are not limited thereto. For example, in other exemplary embodiments, another side of the first substrate SUB1 may protrude relative to the second substrate SUB2. The display driving substrate FPCB including the driving chip IC (as shown in FIG. 3) may be attached to the protruding portion of the first substrate SUB1. A plurality of signal pads DP-PD and PW-PD and a third sensing pad parts TS-PD3 may be electrically connected to the display driving substrate FPCB. The driving chip IC may be bonded and connected to the display driving substrate FPCB, and may be controlled by a controller provided in the display driving substrate FPCB. The driving chip IC may transfer a signal for driving the circuit element layer DP-CL, the sensing element layer TC, or the display element layer DP-OLED.

A sealing member SEAL may be disposed along a border of the first substrate SUB) and the second substrate SUB2 on the non-display area DM-NDA of the display device 1. For example, as shown in the exemplary embodiment of FIG. 9, the sealing member SEAL may extend (e.g., in the first direction DR1 and/or second direction DR2) adjacent to the aligned edges of the left long sides LS11, ILS12, right long sides LS21, LS22 and upper short sides SS11, SS12 of the first substrate SUB1 and the second substrate SUB2 and adjacent the border of the lower short side SS22 of the second substrate SUB2. In the exemplary embodiment of FIG. 9, the sealing member SEAL has a rectangular shape with curved corners that have a substantially same radius of curvature as the corner areas of the first and second substrates SUB1 and SUB2. However, exemplary embodiments of the present inventive concepts are not limited thereto. The sealing member SEAL may bond the first substrate SUB1 of the display panel DP to the second substrate SUB2 of the sensor TS. In an exemplary embodiment, the sealing member SEAL may be a frit adhesive layer, an ultraviolet curable resin, or a thermosetting resin. However, exemplary embodiments of the present inventive concepts are not limited thereto.

As shown in the exemplary embodiment of FIG. 10, the first substrate SUB1 may be spaced apart from the second substrate SUB2 (e.g., in the third direction DR3) by a thickness (e.g., length in the third direction DR3) of a spacer SPC that is formed on the pixel defining layer PDL of the first substrate SUB1. The exemplary embodiment of FIG. 10 illustrates that the space between the first substrate SUB1 and the second substrate SUB2 is empty. However, exemplary embodiments of the present inventive concepts are not limited thereto. For example, in other exemplary embodiments, a filling film may be disposed between the first substrate SUB1 and the second substrate SUB2. In an exemplary embodiment, the filling film may be an epoxy filling film or a silicone filling film.

The second electrode CE may be disposed along a border of the display area DM-DA on an entire portion of the display area DM-DA of the display device 1 and a part of the non-display area DM-NDA. For example, the second electrode CE may be disposed to completely cover the display area DM-DA of the display device 1. As shown in the exemplary embodiment of FIG. 9, end portions forming a boundary line or border of the second electrode CE may be disposed adjacent to the sealing member SE, with the sealing member SE surrounding the end portions of the second electrode CE and with a space provided between the border of the second electrode CE and the sealing member SE.

In an exemplary embodiment, the second electrode CE may be integrally formed on the pixel defining layer PDL, the spacer SPC and the light emitting layer EML.

A second power electrode VSS may be disposed along borders of the main region MR, the bending area BD, and the sub region SR of the first substrate SUB1 from the signal pads PW-PD disposed on one side (e.g., the left side in the second direction DR2) of the sub region SR to the signal pads PW-PD disposed on the other side (e.g., the right side in the second direction DR2) of the subregion SR. In an exemplary embodiment, the second power electrode VSS may be simultaneously formed of the same material as the first and second input electrodes SE1 and SE2 and the first and second output electrodes DE1 and DE2.

As shown in the exemplary embodiment of FIG. 10, the second power electrode VSS and the second electrode CE may be disposed to overlap each other in some areas in the third direction DR3. The second electrode CE may be electrically and/or physically connected to the second power electrode VSS disposed on the second intermediate inorganic layer 20 through a sixth through hole CH6 formed in the intermediate organic layer 30 and the pixel defining layer PDL. Therefore, the second electrode CE may receive the second power supply voltage ELVSS from the second power electrode VSS.

In an exemplary embodiment of the present inventive concepts, the boundary line/border of the second electrode CE may have a first radius of curvature R1 in an area near a corner where the upper short side SS12 and the left long side LS12 of the second substrate SUB2 are in contact with each other, and in an area near a corner where the upper short side SS12 and the right long side LS22 of the second substrate SUB2 are in contact with each other. The first radius of curvature R1 may be substantially the same as a radius of curvature of corner areas of the first and second substrates SUB1 and SUB2 and a radius of curvature of the sealing member SEAL.

The border of the second electrode CE may have a second radius of curvature R2 in an area near a corner where the lower short side SS22 and the left long side LS12 of the second substrate SUB2 are in contact with each other and an area near a corner where the lower short side SS22 and the right long side LS22 of the second substrate SUB2 are in contact with each other. The second radius of curvature R2 of the border of the second electrode CE may be different from the first radius of curvature R1. For example, in an exemplary embodiment, the second radius of curvature R2 of the second electrode CE may be greater than the first radius of curvature R1.

The second electrode CE and the sealing member SEAL may be spaced apart from each other by a predetermined distance on a plane. For example, the predetermined distance between the second electrode CE and the sealing member SEAL may be on a plane defined in the first direction DR1 and/or second direction DR2 (e.g., a direction parallel to an upper surfaces of the first substrate SUB1). When the border of the second electrode CE has the second radius of curvature R2 in the area near the corner where the lower short side SS22 and the left long side LS12 of the second substrate SUB2 are in contact with each other and the area near the corner where the lower short side SS22 and the right long side LS22 of the second substrate SUB2 are in contact with each other, the second radius of curvature R2 is greater than radii of curvature of the adjacent corner areas of the first and second substrates SUB1 and SUB2. Therefore, a distance DIST2 between the border of the second electrode CE and the sealing member SEAL in the corner regions adjacent the border of the second electrode CE having the second radius of curvature R2 may be larger than a distance DIST1 between the border of the second electrode CE and the sealing member SEAL in the corner region adjacent the border of the second electrode CE having the first radius of curvature R1.

For example, as a radius of curvature of the curve increases, the area of the curve gets closer to a straight line. Therefore, the second electrode CE having a border with the second radius of curvature R2 that is greater than the first radius of curvature R1 may have an increased distance DIST2 from the sealing member SEAL than the distance DIST1 if the second electrode CE had maintained a constant first radius of curvature R1.

First sensing pad parts TS-PD1 may be disposed on the increased separation space between the second electrode CE and the sealing member SEAL on the corner regions adjacent the second electrode CE having a border with the second radius of curvature R2. In an exemplary embodiment, the first sensing pad parts TS-PD1 and second sensing pad parts TS-PD2 disposed to face the first sensing pad parts TS-PD1 may have a rectangular shape on a plane. For example, since the increased separation space between the second electrode CE and the sealing member SEAL has the widest width in a diagonal direction between the first direction DR1 and the second direction DR2, the first and second sensing pad parts TS-PD1 and TS-PD2 may have a rectangular shape extending in the diagonal direction. However, exemplary embodiments of the present inventive concepts are not limited thereto and the first and second sensing pad parts TS-PD1 and TS-PD2 may have a variety of different shapes. For example, in another exemplary embodiment, the first and second sensing pad parts TS-PD1 and TS-PD2 may be formed in a curved shape along a curvature of the second electrode CE and the sealing member SEAL. While the exemplary embodiment of FIG. 9 shows the first substrate SUB1, the second substrate SUB2, the border of the second electrode CE and the sealing member SEAL having a rectangular shape with curved corners, in other exemplary embodiments, these elements may have different shapes that include corners and the radius of curvature of at least one corner of the border of the second electrode may be greater than the radius of curvature of the corners of the first substrate SUB1, the second substrate SUB2, the sealing member SEAL and the remaining corners of the border of the second electrode CE to provide an increased area for disposing the first and second sensing pad parts TS-PD1, TS-PD2.

As shown in the exemplary embodiment of FIG. 10, the first sensing pad parts TS-PD1 may be electrically connected to third sensing pad parts TS-PD3 via a third sensing wire TSL3 and a sensing connection wire TS-Br. In an exemplary embodiment, the third sensing wire TSL3 may be simultaneously formed of the same material as the first control electrode GE1, the second control electrode GE2, or the like. The sensing connection line TS-Br may be simultaneously formed of the same material as the first and second input electrodes SE1, SE2 and the first and second output electrodes DE1 and DE2, or the like. The first sensing pad parts TS-PD1 may be simultaneously formed of the same material as the first and second electrodes AE and CE or the like.

The first sensing pad parts TS-PD1 may be electrically and/or physically connected to the sensing connection line TS-Br through a seventh through hole CH7 formed in the intermediate organic layer 30. The sensing connection wire TS-Br may be electrically and/or physically connected to the third sensing wire TSL3 through an eighth through hole CH8 formed in the second intermediate inorganic layer 20.

The second sensing pad parts TS-PD2 may be formed on the second conductive layer TS-CL2, and may be divided and formed on both outer sides of a side adjacent to a portion where the first substrate SUB1 relatively protrudes. For example, as shown in the exemplary embodiment of FIG. 9, the second sensing pad parts TS-PD2 may be formed on a left side and right side (e.g., in the second direction DR2) of the lower short side SS22 of the second substrate SUB2. In the divided and formed second sensing pad parts TS-PD2, one of the outer sides may be formed by dividing into a plurality of upper electrodes UE (described in more detail later) for applying or detecting voltages of the first sensing electrodes TE1 in the first direction DR1 of a sensing electrode array, and the other one may be formed by dividing into a plurality of upper electrodes UE for applying or detecting voltages of the second sensing electrodes TE2 in the second direction DR2. However, exemplary embodiments of the present inventive concepts are not limited thereto. For example, in some exemplary embodiments, the second sensing pad parts TS-PD2 may be located only on one side of the second substrate SUB2 where the first substrate SUB1 protrudes therefrom.

The second conductive layer TS-CL2 of the sensing element layer TC may be formed on the sensing insulating layer TS-IL. The sensing insulation layer TS-IL may include a plurality of protrusions PT1 in an area overlapping the first sensing pad parts TS-PD1 in the third direction DR3. The second conductive layer TS-CL2 disposed to overlap the plurality of protrusions PT1 in the third direction DR3 may be defined as a plurality of upper electrodes UE. In an exemplary embodiment, a thickness of the protrusion PT1 (e.g., length in the third direction DR3) may be substantially the same as a thickness of the spacer SPC (e.g., length in the third direction DR3). As a result, the first sensing pad parts TS-PD1 may be electrically connected to the second sensing pad parts TS-PD2.

The first and second conductive layers TS-CL1 and TS-CL2 include the first sensing electrodes TE1 and the second sensing electrodes TE2 that cross each other, and the upper electrode UE for transferring a signal to the first and second sensing electrodes TE1 and TE2, respectively. The upper electrode UE may be formed in the second sensing pad parts TS-PD2, and the upper electrode UE may be connected to the lower electrode BE formed in the first substrate SUB1.

The first and second sensing signal lines TSL1 and TSL2 are disposed in the peripheral area NSA outside the display area DM-DA of the display device 1. The first and second sensing signal lines TSL1 and TSL2 are generally provided in the first direction DR1 to connect the first sensing electrodes TE1, the second sensing electrodes TE2, and the second sensing pad parts TS-PD2.

The first conductive layer TS-CL1 may be electrically connected to the second conductive layer TS-CL2 through a ninth through hole CH9 formed in the sensing insulating layer TS-IL. As described above, each of the first and second conductive layers TS-CL1 and TS-CL2 is patterned by the plurality of first and second sensing sensor parts SP1 and SP2 disposed by being spaced apart from each other on a plane. Therefore, it should be understood that all of the first conductive layer TS-CL1 and the second conductive layer TS-CL2 are not conductive.

As the first sensing pad parts TS-PD1 are disposed in the increased space between the second electrode CE and the sealing member SEAL, the first and second sensing pad parts TS-PD1 and TS-PD2 electrically connecting the first substrate SUB1 of the display panel DP and the second substrate SUB2 of the sensor TS does not have to be disposed outside the seal member SEAL. Therefore, the benefit of reducing a dead space of the display device 1 is provided.

Hereinafter, other exemplary embodiments of the present inventive concepts will be described. In the following exemplary embodiments of the present inventive concepts, the same configuration as the already described embodiment will be omitted or simplified, and the differences will be mainly described.

Figure 13:
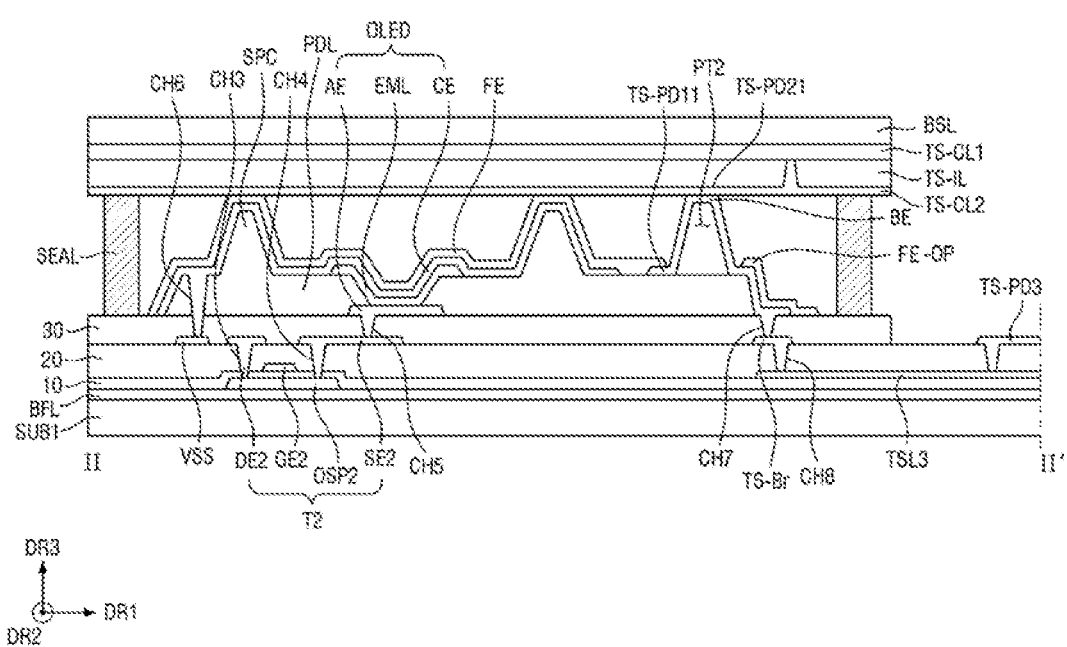
FIGS. 13 to 15 are cross-sectional views taken along line II-II' of FIG. 9 according to exemplary embodiments of the present inventive concepts.
Figure 14:
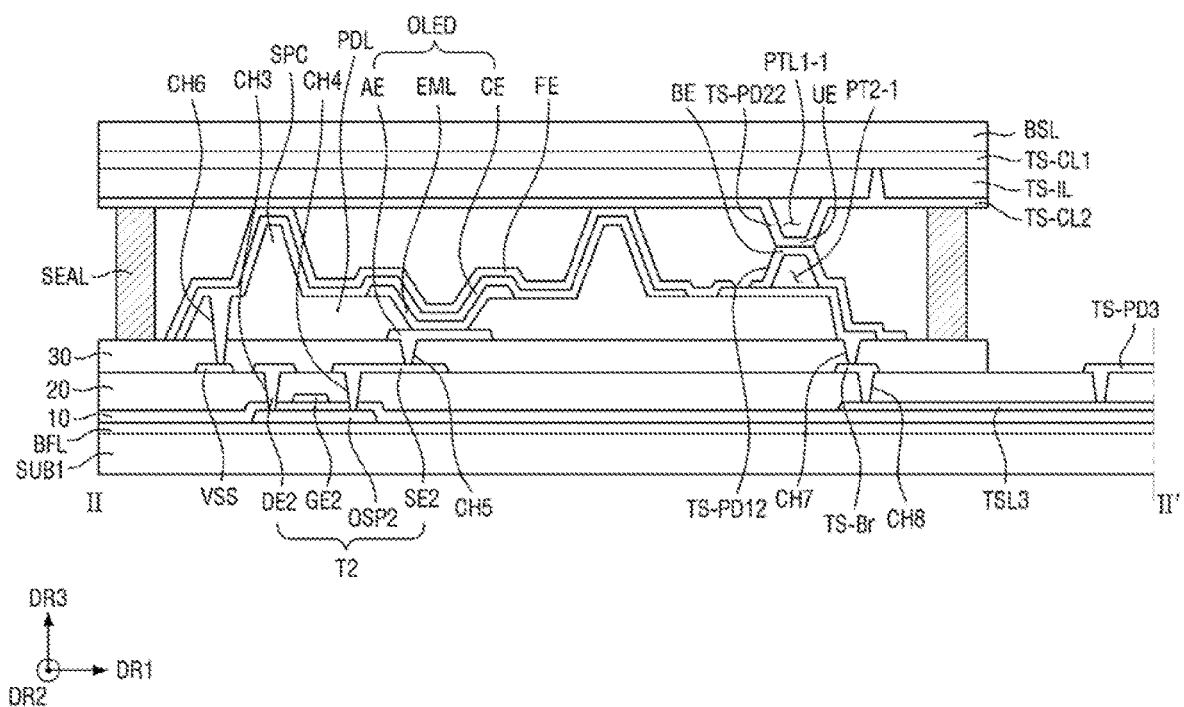
Figure 15:
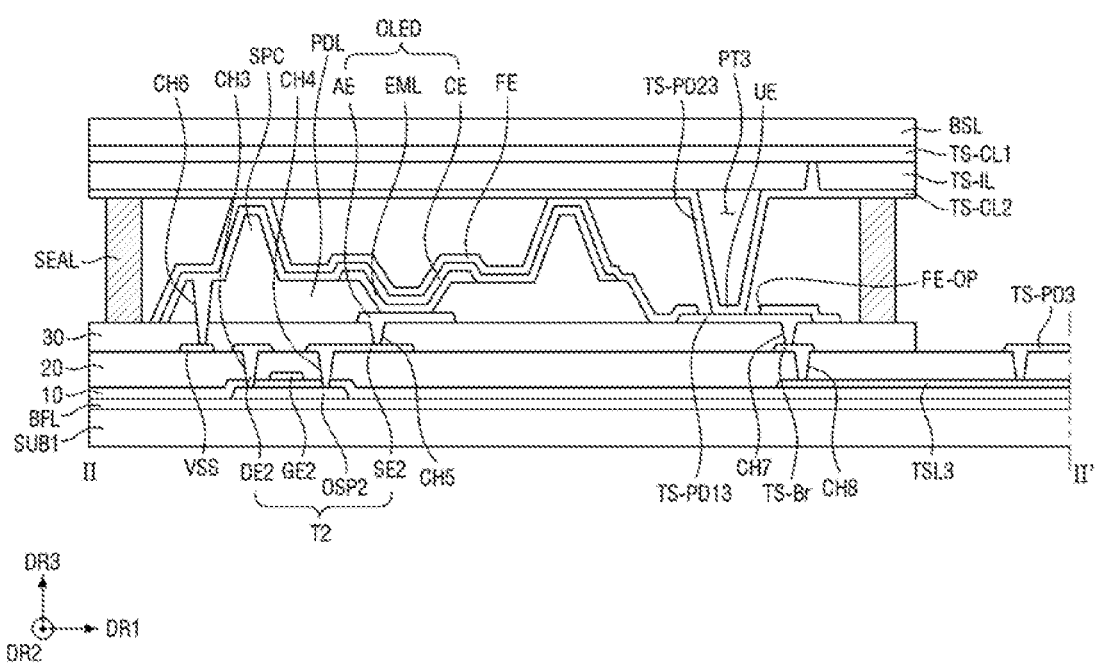

FIGS. 13 to 15 are cross-sectional views taken along line II-II' of FIG. 9 according to another exemplary embodiment of the present inventive concepts.

Referring to FIGS. 13 to 15, the structures of the first sensing pad parts TS-PD1 and the second sensing pad parts TS-PD2 may be variously changed during a manufacturing process.

As illustrated in the exemplary embodiment of FIG. 13, the first sensing pad parts TS-PD11 of the first substrate SUB1 may be formed on the pixel defining layer PDL (e.g., in the third direction DR3). The pixel defining layer PDL may include a plurality of protrusions PT2 in an area overlapping the second sensing pad parts TS-PD21 in the third direction DR3. A metal layer forming one of the first electrode AE and the second electrode CE disposed to overlap the plurality of protrusions PT2 in the third direction DR3 may be defined as a plurality of lower electrodes BE. A thickness of the protrusion PT2 (e.g., length in the third direction DR3) may be substantially the same as a thickness of the spacer SPC (e.g., length in the third direction DR3). As a result, the first sensing pad parts TS-PD11 may be electrically connected to the second sensing pad parts TS-PD21.

In an exemplary embodiment, the plurality of protrusions PT2 formed on the pixel defining layer PDL of the first substrate SUB1 may be formed at the same time when the spacer SPC is formed.

Further, as shown in FIG. 14, the second conductive layer TS-CL2 of the sensing element layer TC may be formed on the sensing insulating layer TS-IL. The sensing insulation layer TS-IL may include a plurality of protrusions PT1_1 in an area overlapping the first sensing pad parts TS-PD12 in the third direction DR3. The second conductive layer TS-CL2 disposed to overlap the plurality of protrusions PT1_1 in the third direction DR3 may be defined as a plurality of upper electrodes UE.

The first sensing pad parts TS-PD12 of the first substrate SUB1 may be formed on the pixel defining layer PDL. The pixel defining layer PDL may include a plurality of protrusions PT2_1 in an area overlapping the second sensing pad parts TS-PD2 in the third direction DR3. A metal layer forming one of the first electrode AE and the second electrode CE disposed to overlap the plurality of protrusions PT2_1 in the third direction DR3 may be defined as a plurality of lower electrodes BE.

The sum of thicknesses of the two protrusions PT1_1 and PT2_1 formed in the first and second substrates (e.g., lengths in the third direction DR3) may be substantially the same as the thickness of the spacer SPC (e.g., length in the third direction DR3). As a result, the first sensing pad parts TS-PD12 may be electrically connected to the second sensing pad parts TS-PD2.

Further, as shown in the exemplary embodiment of FIG. 15, the second conductive layer TS-CL2 of the sensing element layer TC may be formed on the sensing insulating layer TS-IL. The sensing insulation layer TS-IL may include a plurality of protrusions PT3 in an area overlapping the first sensing pad parts TS-PD13 in the third direction DR3. The second conductive layer TS-CL2 disposed to overlap the plurality of protrusions PT3 in the third direction DR3 may be defined as a plurality of upper electrodes UE.

The first sensing pad parts TS-PD13 may be disposed on the intermediate organic layer 30. Therefore, in order for the plurality of protrusions PT3 to contact the first sensing pad parts TS-PD12, a thickness of the plurality of protrusions PT3 (e.g., length in the third direction DR3) may be greater than the thickness of the spacer SPC (e.g., length in the third direction DR3).

Figure 16:
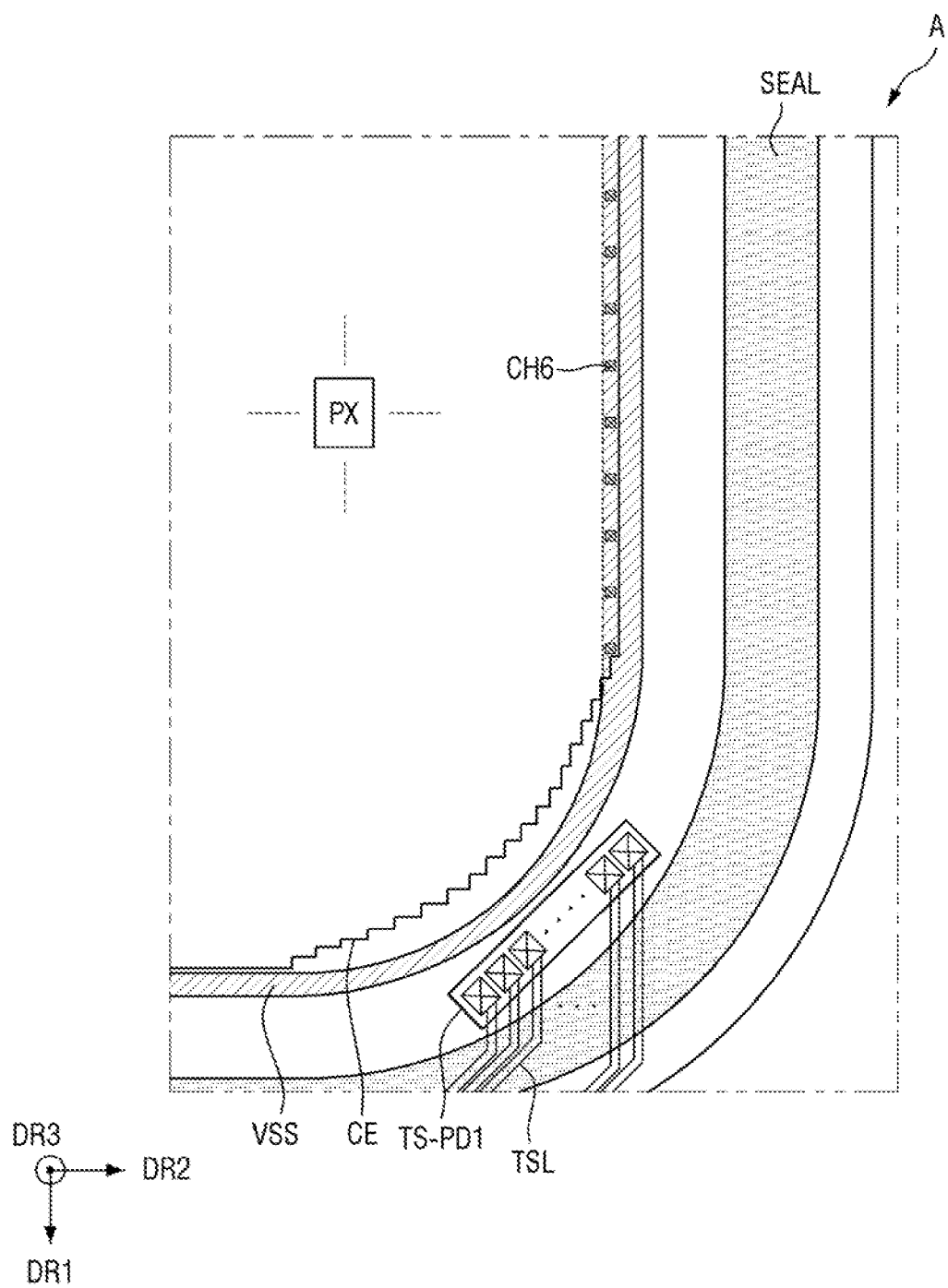
FIGS. 16 to 17 are enlarged view of portion A of FIG. 9 showing a first substrate according to exemplary embodiments of the present inventive concepts.
Figure 17:
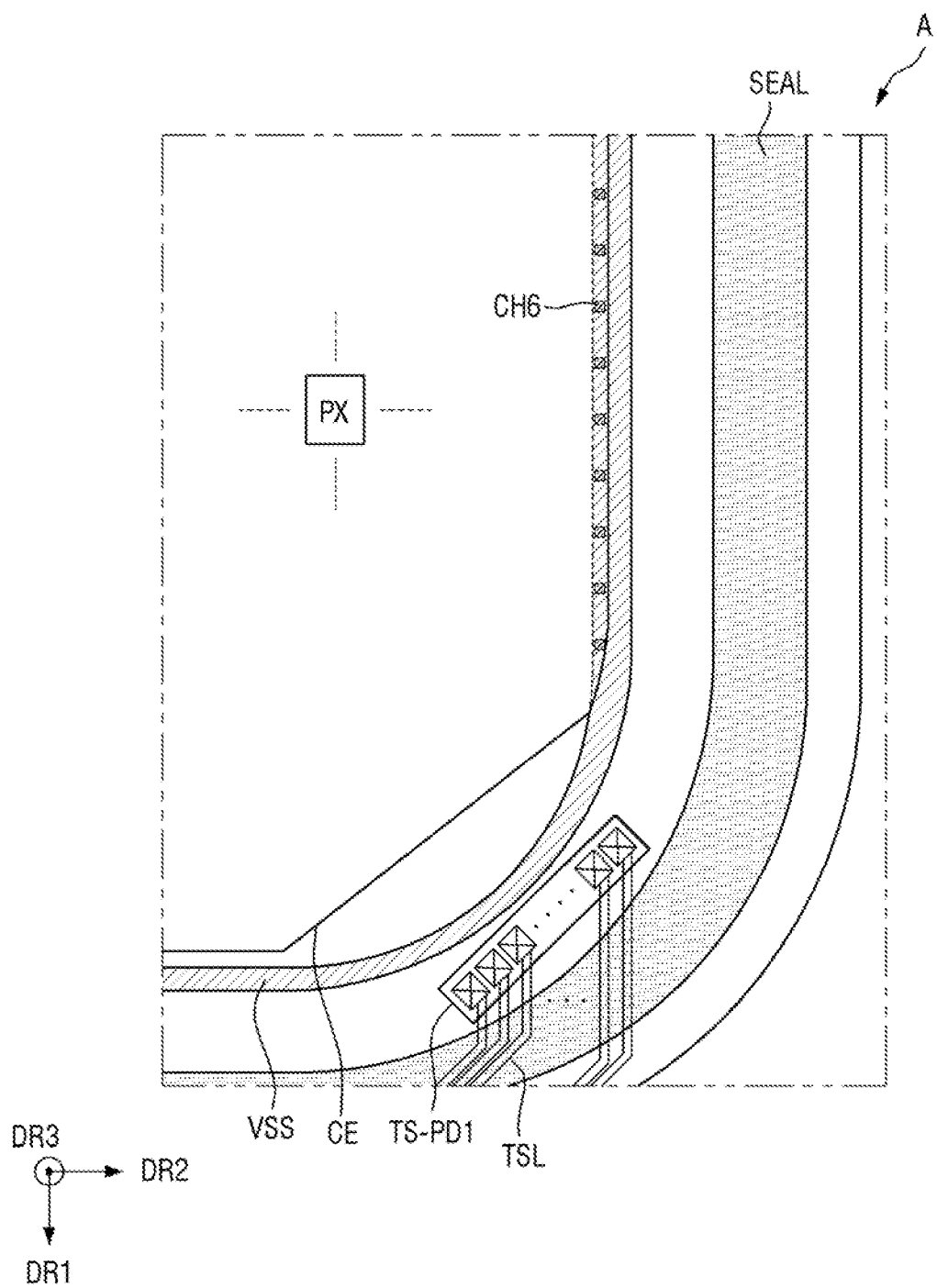

FIGS. 16 to 17 are enlarged views of portion A of FIG. 9 showing a first substrate according to exemplary embodiments of the present inventive concepts.

Referring to FIGS. 9, 16, and 17, it may be seen that a boundary line of a corner area of the second electrode CE is not limited to a curved shape.

More specifically, the second electrode CE may have a first radius of curvature R1 in an area near a corner where the upper short side SS12 and the left long side LS12 of the second substrate SUB2 are in contact with each other, and in an area near a corner where the upper short side SS12 and the right long side LS22 of the second substrate SUB2 are in contact with each other. The first radius of curvature R1 may be substantially the same as a radius of curvature of corner areas of the first and second substrates SUB) and SUB2 and a radius of curvature of the sealing member SEAL.

As shown in FIGS. 16 and 17, the second electrode CE may have either of a step shaped boundary line or a straight line shaped boundary line, in an area near a corner where the lower short side SS22 and the left long side LS12 of the second substrate SUB2 are in contact with each other and an area near a corner where the lower short side SS22 and the right long side LS22 of the second substrate SUB2 are in contact with each other. Here, the boundary line of the second electrode CE may be disposed to overlap in the third direction DR3 in an area between where an imaginary border of the second electrode CE having the first radius of curvature R1 would be located and a border of the display area DM-DA of the display device 1. The border of the second electrode CE having the second radius of curvature extends closer to a border of the display area than an instance in which the border had the first radius of curvature.

The second electrode CE and the sealing member SEAL may be spaced apart from each other by a predetermined distance on a plane (e.g., in the first direction DR and/or second direction DR2). When the second electrode CE has either of the step shaped boundary line or the straight line shaped boundary line, in the area near the corner where the lower short side SS22 and the left long side LS12 of the second substrate SUB2 are in contact with each other and the area near the corner where the lower short side SS22 and the right long side LS22 of the second substrate SUB2 are in contact with each other, the second electrode CE may have the increased distance from the sealing member SEAL maintaining the constant radius of curvature.

In concluding the detailed description of the exemplary embodiments of the present inventive concepts, those skilled in the art will appreciate that many variations and modifications can be made to the exemplary embodiments without substantially departing from the principles of the present inventive concepts.

What is claimed is:

1. A display device comprising:
   a first substrate having a display area, a non-display area surrounding the display area, and a protruding area extending from a side of the non-display area;
   a first sensing pad part formed in the non-display area adjacent to the protruding area on the first substrate;
   a circuit element layer positioned in the display area on the first substrate;
   a display element layer positioned on the circuit element layer, the display element layer including a light-emitting layer and a second electrode positioned on the light-emitting layer;
   a second substrate disposed to overlap the first substrate in a thickness direction, wherein the second substrate does not overlap the protruding area;
   a second sensing pad part formed on the second substrate to overlap with the first sensing pad part in the thickness direction; and
   a sealing member disposed along a border of the second substrate and configured to attach the first substrate and the second substrate to each other;
   wherein the first sensing pad part and the second sensing pad part are disposed between a border of the second electrode and the sealing member.

2. The display device of claim 1, wherein:
   each of the first substrate, the second substrate, and the border of the second electrode include a left long side and a right long side extending in a first direction and an upper short side and a lower short side extending in a second direction intersecting the first direction, wherein corners where the left long side and the right long side meet the upper short side and the lower short side form a curved surface.

3. The display device of claim 2, wherein corners of the border of the second electrode where the upper short side of the second electrode meets the left long side of the border of the second electrode and the right long side of the border of the second electrode have a first radius of curvature, and corners of the border of the second electrode where the lower short side of the border of the second electrode meets the left long side of the border of the second electrode and the right long side of the border of the second electrode has a second radius of curvature different from the first radius of curvature.

4. The display device of claim 3, wherein the first radius of curvature of the border of the second electrode is the same as a radius of curvature of corners of the first substrate where the upper short side of the first substrate meets the left long side of the first substrate and the right long side of the first substrate, and corners of the second substrate where the upper short side of the second substrate meets the left long side of the second substrate and the right long side of the second substrate.

5. The display device of claim 3, wherein the first radius of curvature of the border of the second electrode is smaller than the second radius of curvature of the border of the second electrode.

6. The display device of claim 5, wherein the first sensing pad part and the second sensing pad part are disposed between the border of the second electrode having the second radius of curvature and the sealing member.

7. The display device of claim 3, wherein the border of the second electrode in at least one of the corners where the lower short side of the border of the second electrode meets the left long side of the border of the second electrode and the right long side of the border of the second electrode has a step shape or is a straight line.

8. The display device of claim 7, wherein the border of the second electrode having the second radius of curvature extends closer to a border of the display area than the border of the second electrode having the first radius of curvature.

9. The display device of claim 1, wherein an area of the second electrode is larger than an area of the display area.

10. The display device of claim 1, wherein the circuit element layer comprises:
    a first power supply voltage electrode and a second power supply voltage electrode,
    wherein a voltage flowing through the second power supply voltage electrode is lower than a voltage flowing through the first power supply voltage electrode.

11. The display device of claim 10, wherein the second power supply voltage electrode is disposed to partially overlap the border of the second electrode in the thickness direction.

12. The display device of claim 11, wherein the second electrode and the second power supply voltage electrode are electrically connected.

13. The display device of claim 10, wherein the first sensing pad part and the second sensing pad part are disposed between the second power supply voltage electrode and the sealing member.

14. The display device of claim 1, wherein the second substrate comprises:
    a first conductive layer;
    an insulating layer disposed on the first conductive layer; and
    a second conductive layer disposed on the insulating layer.

15. The display device of claim 14, wherein the first sensing pad part comprises a plurality of lower electrodes, and the second sensing pad part comprises a plurality of upper electrodes, the upper electrodes and the lower electrodes being electrically connected.

16. The display device of claim 15, wherein:
the display element layer further includes:
a first electrode connected to a source or drain electrode of a thin film transistor provided in the circuit element layer; and
a pixel defining layer defining a pixel area of the display element layer and exposing the first electrode;
the insulating layer comprises a plurality of first protrusions in an area overlapping the first sensing pad part;
the second conductive layer is disposed to overlap the plurality of first protrusions in the thickness direction and forms the plurality of upper electrodes,
wherein a length of the upper electrodes in the thickness direction is the same as a length of a spacer on the pixel defining layer in the thickness direction.

17. The display device of claim 15, wherein:
the display element layer includes a pixel defining layer defining a pixel area of the display element layer and exposing a first electrode; and
a spacer is disposed on the pixel defining layer, the spacer configured to maintain a distance between the first substrate and the second substrate.

18. The display device of claim 1, further comprising:
a third sensing pad part disposed on the protruding area of the first substrate and connected to a display driving substrate.

19. The display device of claim 18, wherein a sensing wire is configured to electrically connect the first sensing pad part to the third sensing pad part.

20. The display device of claim 19, wherein the sealing member is disposed to overlap an area of the sensing wire in the thickness direction.

21. A display device comprising:
a first substrate having a display area and a non-display area, the first substrate including a plurality of corners, each of the plurality of corners of the first substrate having a first radius of curvature;
a circuit element layer positioned on the display area of the first substrate;
a display element layer positioned on the circuit element layer, the display element layer including a light-emitting layer and a second electrode positioned on the light-emitting layer, the second electrode having a border in the non-display area;
a second substrate disposed to overlap the first substrate in a thickness direction, the second substrate including a plurality of corners, each of the plurality of corners of the second substrate having the first radius of curvature;
a sealing member disposed along a border of the second substrate and overlapping the non-display area of the first substrate in the thickness direction, the sealing member configured to attach the first substrate and the second substrate to each other, the sealing member having a plurality of corners, each of the plurality of corners of the sealing member having the first radius of curvature;
the border of the second electrode includes a plurality of corners, wherein at least one of the plurality of corners of the border of the second electrode has the first radius of curvature and at least one of the plurality of corners of the border of the second electrode has a second radius of curvature that is greater than the first radius of curvature, the second radius of curvature providing a larger space between the border of the second electrode and the sealing member than the first radius of curvature;
a first sensing pad part disposed on the non-display area of the first substrate and a second sensing pad part disposed on the second substrate, wherein the first sensing pad part and the second sensing pad part overlap each other and are disposed between the border of the second electrode having the second radius of curvature and the sealing member.

* * * * *